United States Patent [19]

Tsang et al.

[11] Patent Number: 5,220,206
[45] Date of Patent: Jun. 15, 1993

[54] CONTROL APPARATUS WITH IMPROVED RECOVERY FROM POWER REDUCTION, AND STORAGE DEVICE THEREFOR

[75] Inventors: Steven T. Tsang, Newton; Gregory T. Koker, Stoughton, both of Mass.

[73] Assignee: Analog Devices, Inc., Norwood, Mass.

[21] Appl. No.: 921,446

[22] Filed: Jul. 28, 1992

Related U.S. Application Data

[63] Continuation of Ser. No. 591,726, Oct. 2, 1990, abandoned, which is a continuation-in-part of Ser. No. 545,887, Jun. 29, 1990, Pat. No. 5,120,990.

[51] Int. Cl.⁵ .................. G11C 11/00; H03K 5/22; H03K 5/13
[52] U.S. Cl. .................. 307/296.3; 307/296.4; 307/353; 307/359; 307/602; 328/55
[58] Field of Search .............. 307/269, 353, 355, 359, 307/602, 603, 606, 511, 296.3, 296.4, 296.8; 328/55, 133, 155; 341/126, 141, 155, 158, 164, 165

[56] References Cited

U.S. PATENT DOCUMENTS

| | | | |
|---|---|---|---|
| 3,824,588 | 7/1974 | Vermillion | 341/165 |
| 4,028,534 | 6/1977 | Tucker | 341/164 |
| 4,145,743 | 3/1979 | DiCiurcio | 307/359 |
| 4,204,173 | 5/1980 | Aschwanden | 307/359 |
| 4,204,260 | 5/1980 | Nysen | 307/359 |
| 4,374,362 | 2/1983 | Sutherland et al. | 307/359 |
| 4,407,020 | 9/1983 | Helliwell et al. | 341/165 |
| 4,532,494 | 7/1985 | Sasaki et al. | 341/158 |
| 4,549,098 | 10/1985 | Fushiki | 307/359 |
| 4,602,374 | 7/1986 | Nakamura et al. | 307/359 |
| 4,672,639 | 6/1987 | Tanabe et al. | |
| 4,679,028 | 7/1987 | Wilson et al. | 341/158 X |
| 4,683,382 | 11/1984 | Sakurai et al. | 307/296.3 |
| 4,686,390 | 8/1987 | Cleary, Jr. et al. | 307/359 |
| 4,788,507 | 11/1988 | Berkowitz et al. | 307/359 |
| 4,905,255 | 2/1990 | Aalaei | 307/359 |
| 5,118,975 | 6/1992 | Hillis et al. | 307/602 |
| 5,173,617 | 12/1992 | Alsup et al. | 307/269 |

OTHER PUBLICATIONS

Fletcher; "An Engineering Approach to Digital Design"; 1980; pp. 12–19.
Bazes, M., "A Novel Precision MOS Synchronous Delay Line" in *IEEE Journal of Solid-State Circuits*, vol. SC-20, No. 6, Dec. 1985, pp. 1265–1271.
Johnson, M. G. and Hudson, E. L., "A Variable Delay Line PLL for CPU-Coprocessor Synchronization" in *IEEE Journal of Solid-State Circuits*, vol. 23, No. 5, Oct. 1988, pp. 1218–1223.

*Primary Examiner*—William L. Sikes
*Assistant Examiner*—Terry D. Cunningham
*Attorney, Agent, or Firm*—Wolf, Greenfield & Sacks

[57] ABSTRACT

Apparatus and method are provided for saving and (upon demand) restoring a control signal for a signal-controlled system. A control signal generated by or within that system is provided to a multiplexer, which normally produces that control signal. That control signal is digitized and stored by a storage device as follows. The output of the storage device is provided both to the multiplexer and to a comparator. The comparator also receives the output of the multiplexer, and compares the output of the storage device and the multiplexer. The comparator provides a signal to the storage device to increment or decrement the storage device based on whether the signal produced by the storage device is less than, or greater than or equal to, the control signal produced by the multiplexer. The multiplexer output is also provided to the signal-controlled system to provide the control signal thereto. Upon demand as indicated by a selection signal provided to the multiplexer, the stored signal from the storage device is outputted by the multiplexer, and is accordingly provided by the multiplexer to the system as the control signal. The storage device includes a resistor ladder having a plurality of evenly or unevenly incremented outputs, a selector for selecting one of those outputs to be provided to the multiplexer and to the comparator, and a counter controlled by the comparator for controlling operation of the selector.

22 Claims, 23 Drawing Sheets

MODES OF OPERATION

CONTROL APPARATUS WITH IMPROVED RECOVERY FROM POWER REDUCTION, AND STORAGE DEVICE THEREFOR

CROSS-REFERENCE TO RELATED APPLICATION

This application is a continuation of application Ser. No. 07/591,726, filed Oct. 2, 1990, now abandoned, which was a continuation-in part of application Ser. No. 07/545,887 filed Jun. 29, 1990, now U.S. Pat. No. 5,120,990, issued Jun. 9, 1992.

FIELD OF THE INVENTION

The present invention relates to control apparatus having at least one control signal, and more particularly to apparatus for improved recovery from reduced power operation of that control apparatus.

BACKGROUND OF THE INVENTION

Those concerned with the development of signal-controlled electrical devices have long recognized the need to conserve power by temporarily restricting operation of such devices, while retaining the value(s) of such control signal(s) for use when full operation is restored The present invention fulfills this need.

It is often desirable for the user of electronic equipment to have the ability to partially shut down such equipment, such as during periods of relative inactivity, in order to conserve power. Often, such equipment utilizes one or more internally generated or externally provided control signals for controlling some aspect of operation of that equipment. One example of such a control signal is a feedback control signal, such as the voltage or other control in a phase locked loop, or the reference voltage controlling the amount of delay produced by a synchronous delay line. If there is to be a partial shutdown of equipment so controlled, then there will be a need to reduce power to various parts of the system. As a result, the control voltage or other control signal would not be maintained, and so would be lost. If full power is thereafter restored, it will then be necessary to completely redetermine the lost control signal. Particularly if a feedback control signal is involved, such as in a phase-locked loop or in a synchronous delay line, redetermining the lost control signal can require a substantial number of system cycles. As a result, relatively substantial delays can be encountered in such restart of signal-controlled equipment. This situation is made more difficult if the signal or signals involved are analog signals, especially if they were generated by analog circuitry such as an operational amplifier. Such signals are more easily lost, and the static power consumption of an operational amplifier is sufficiently relatively substantial that a partial shutdown would most desirably involve stopping operation of the operational amplifier.

There exist applications in which there is a need to generate multiple internal clock phases or sub phases from a single input clock, all of which are synchronized together, wherein the generated clock signals are corrected for phase and frequency errors, particularly phase errors of integral multiples of 360°.

It has been a general practice to employ MOS synchronous delay lines to provide additional timing edges from a reference clock signal. Although such devices have served the purpose, they have not proven entirely satisfactory under all conditions of service because, particularly with larger frequency range requirements, there is a need to correct the outputs of such delay lines for phase not only within a range of 0°–360°, but also to correct phase errors which are integral multiples of 360°. Such correction is needed so that the outputs remain relatively in phase with each other.

One such synchronous delay line is described in Bazes, M., "A Novel Precision MOS Synchronous Delay Line" in *IEEE Journal of Solid State Circuits*, Vol. SC-20, No. 6, December 1985, pp. 1265–1271, which is hereby incorporated by reference. An integrated phase-locked loop including phase detection is described in Johnson, M. G. and Hudson, E. L., "A Variable Delay Line PLL for CPU-Coprocessor Synchronization" in IEEE *Journal of Solid State Circuits*, Vol. 23, No. 5, October 1988, pp. 1218–1223, which is also hereby incorporated by reference. However, the delay lines, and the phase detectors of Johnson and Hudson, and of Bazes, can be operated over only a limited frequency range, and are subject to start-up or fractional frequency lock-up problems, since a known precision clock input is required. If the user needs more flexible clocking requirements, then problems can occur. In Bazes and especially in Johnson and Hudson, the clock waveform input is very controlled and limited to a very small frequency variation. If the user, erroneously or otherwise, would alter the clock frequency in the middle of a cycle, or power the system up and down, then the system of Bazes, and the system of Johnson and Hudson, would likely not operate properly.

Furthermore, in both Bazes and in Johnson and Hudson, if there is a user requirement to substantially reduce power consumption, such that the clock input ceases, then once full power is regained and clock operation is restarted, the system must completely restart as if there had been no previous operation of the system. Such reinitialization of the system introduces delays. This problem is overcome by the present invention.

SUMMARY OF THE INVENTION

Accordingly, an object of the present invention is to provide apparatus and method for retaining a control signal in the event of partial shutdown of a system, for provision of the retained signal to that system upon system restart.

Another object of the present invention is to provide apparatus and method enabling faster recovery from and reducing delays caused by partial shutdown of a control system.

A further object of the present invention is to provide apparatus and method for improved recovery from reduced-power operation of a control system.

Still another object of the present invention is to provide signal-controlled apparatus that is capable of retaining its control value(s) even if the apparatus is partially shut down, and, in the event of such partial shutdown, of enabling restarting of the apparatus at control value(s) at least sufficiently close to such value(s) at the time of such partial shutdown so that any delays resulting from reinstating the lost control value(s) are at least limited.

Yet another object of the present invention is to provide apparatus for generating a plurality of differently phased periodic signals that are corrected to have predetermined desired phase relationship, wherein the correction can be stored for use in the event of partial shutdown and restart of such apparatus.

Briefly, these and other objects of the present invention are accomplished by apparatus and method for saving a control signal that would otherwise be lost, and for restoring that control signal to the system when the power reduction ends. Such apparatus includes apparatus for converting the control signal value from an analog value to a digital value and storing that digital value, a first multiplexer for selecting whether the stored value or the actual value of the control signal is to be provided to the system as the control signal, and a comparing device comparing the first multiplexer output and the stored value to determine whether the stored value should be increased or decreased. The save and restore apparatus can include a signal divider producing predetermined increments of the generated control signal, a counter controlled by the comparing device, and a second multiplexer controlled by the counter for selecting one of the plurality of divided outputs from the divider. The divider can be a resistor ladder, voltage divider or current divider. A buffer can be provided for the output of the counter. The second multiplexer can include a decoder for the output of the counter, latches to hold the decoded signal produced by the decoder, and a plurality of selectors such as gates or switches, one for each output of the divider, for permitting passage therethrough of only the one divider output identified by the decoded counter output.

The present invention can be utilized in an analog, tapped voltage-controlled delay line, having a feedback loop around it to match its overall delay to an incoming clock, and utilizing multiple delay elements or stages to produce at the taps multiple phases of the original clock signal The phase detector is used to determine whether the control voltage of the delay line should be changed because of the detection of a phase error. The phase detector is connected to receive a plurality of taps from the delay line, each such tap being drawn from one of the multiple elements of the delay line. Changing the control voltage correspondingly increases or decreases the propagation delay through the delay line, to adjust for any detected phase error.

In such an analog voltage-controlled delay line, the user may wish to reduce power by placing the device in a low power standby mode.

If power is reduced to the analog voltage-controlled delay line, and/or if the incoming clock signal is cut off, then the signal on the feedback loop could be lost. To avoid or reduce the delay that would be caused by regaining the appropriate feedback control value once full power and the incoming clock signal are restored, apparatus for storing and retaining that value, and for providing that value to the feedback loop, are provided.

A voltage or current divider, such as a resistor ladder, provides a plurality of signals to a first multiplexer, which in effect digitizes such output. The divider signal produced by the first multiplexer is selected by a counter. The first multiplexer output is provided to a second multiplexer, which also receives the feedback control value. The output of the first multiplexer, and the output of the second multiplexer, are provided to a comparator. The output of the second multiplexer is compared to the first multiplexer output by the comparator. The output of the comparator is provided to the counter. The counter is thereby incremented or decremented depending on whether the output of the first multiplexer is lower than or greater than the feedback control value. During normal operation, the output of the second multiplexer is the feedback control value controlled by the phase detector, thus allowing normal feedback control. When powerdown mode is required, the counter stops counting, thus holding the position it last held. That position indicates which of the ladder positions matches the feedback control value. The analog sections including the resistor ladder, comparator, charge pump and op amp, and references can then be powered down, thus removing their DC currents, allowing a low power state.

When powerdown mode is terminated, the resistor ladder is powered on and the counter is used to select which rung of the ladder is used to restore the feedback control value. The second multiplexer then produces the output of the first multiplexer, which is then used as the feedback control value. After the feedback control value is restored, the circuit resumes normal operations. Such control of the second multiplexer and the divider is provided by a controller.

A change detector, receiving the incoming clock signal or a divided form of same, and at least one signal from the phase detector, produces a signal indicating whether the feedback control value has become locked into its desired value. This change detector output signal is useful for indicating that the delay line is locked, but is not necessary for restoration of the control value.

Other objects, advantages and novel features of the invention will become apparent from the following detailed description of the invention when considered in conjunction with the accompanying drawings.

BRIEF DESCRIPTION OF THE DRAWINGS

In the drawings,

FIG. 18A is a block diagram of an alternative save and restore component that can be utilized in the apparatus of FIG. 14;

DETAILED DESCRIPTION

Figure 1:
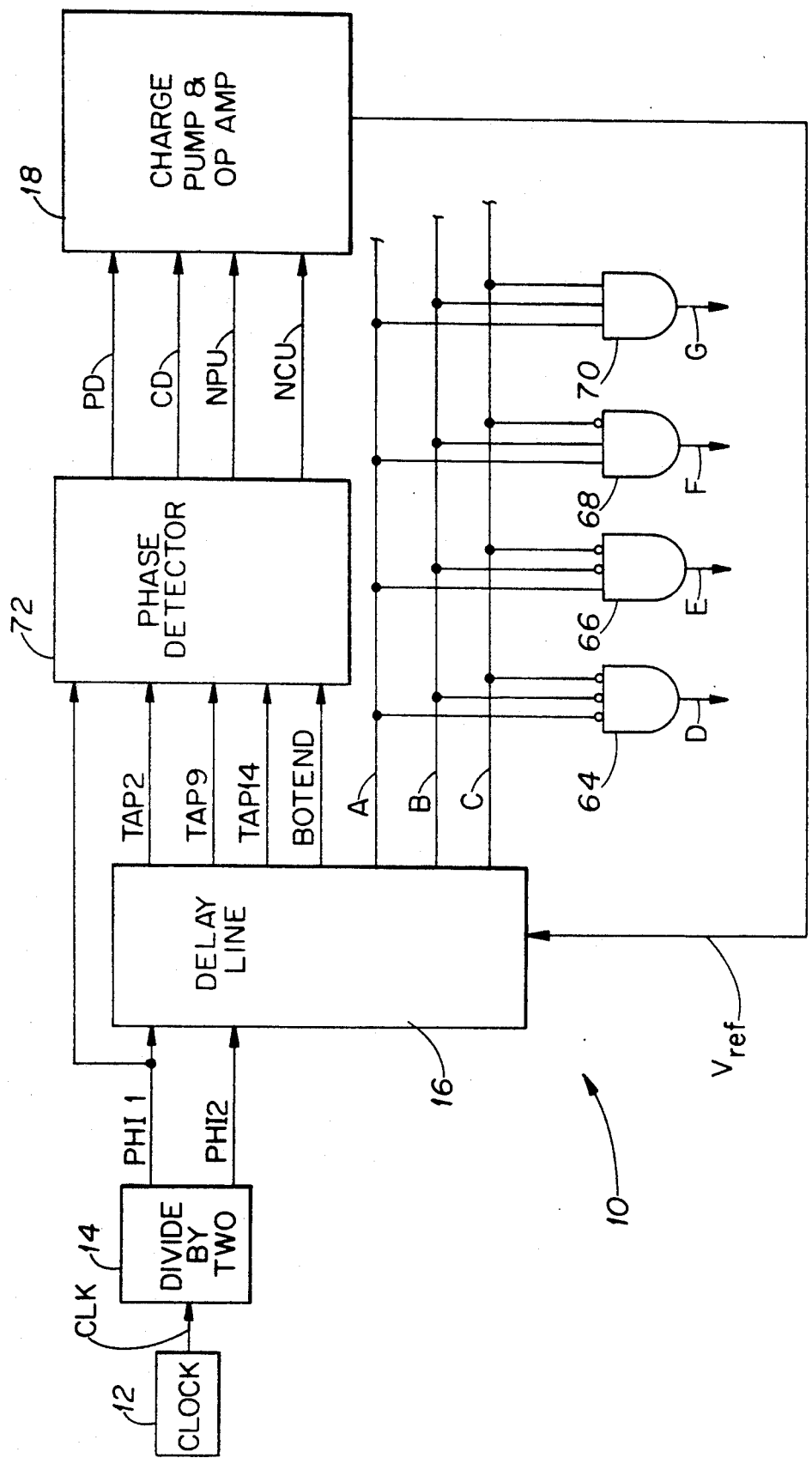
FIG. 1 is a block diagram of one embodiment of a feedback controlled synchronous delay line that can utilize the present invention.
Figure 2:
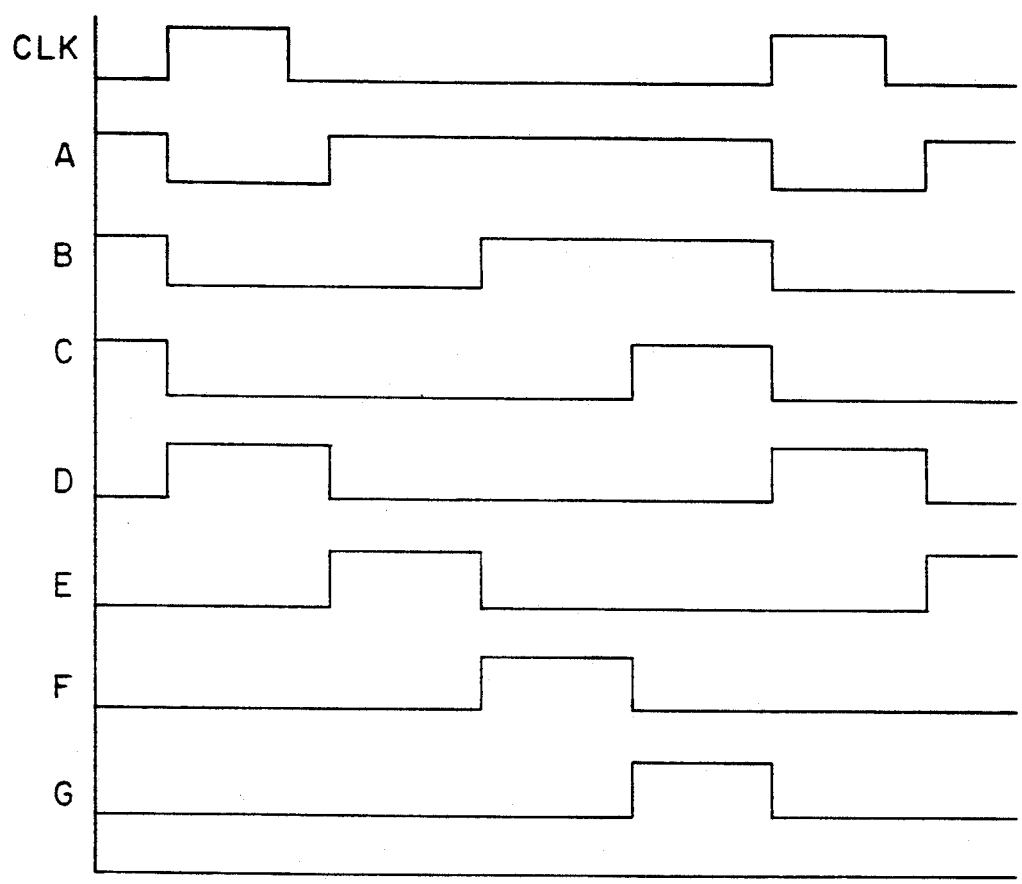
FIG. 2 is a waveform timing diagram for signals that can be received, signals that can be within, and signals that can be produced by the apparatus of FIG. 1.

Referring now to the drawings, wherein like reference characters designate like or corresponding parts throughout the several views, there is shown in FIG. 1 a synchronous delay line 10 utilized as an analog clock signal generator, and receiving a clock signal input CLK from clock 12. Clock signal CLK, shown in FIG. 2, is provided to divide-by-two component 14. Divide by-two 14 produces two divided clock signals PHI1 and PHI2, each of which is provided to an input of segmented delay line 16. Signals PHI1 and PHI2 are 180° out of phase with each other. Delay line 16 is controlled by reference voltage $V_{ref}$, which is produced by charge pump 18 as a feedback control signal, as described below.

Figure 3:
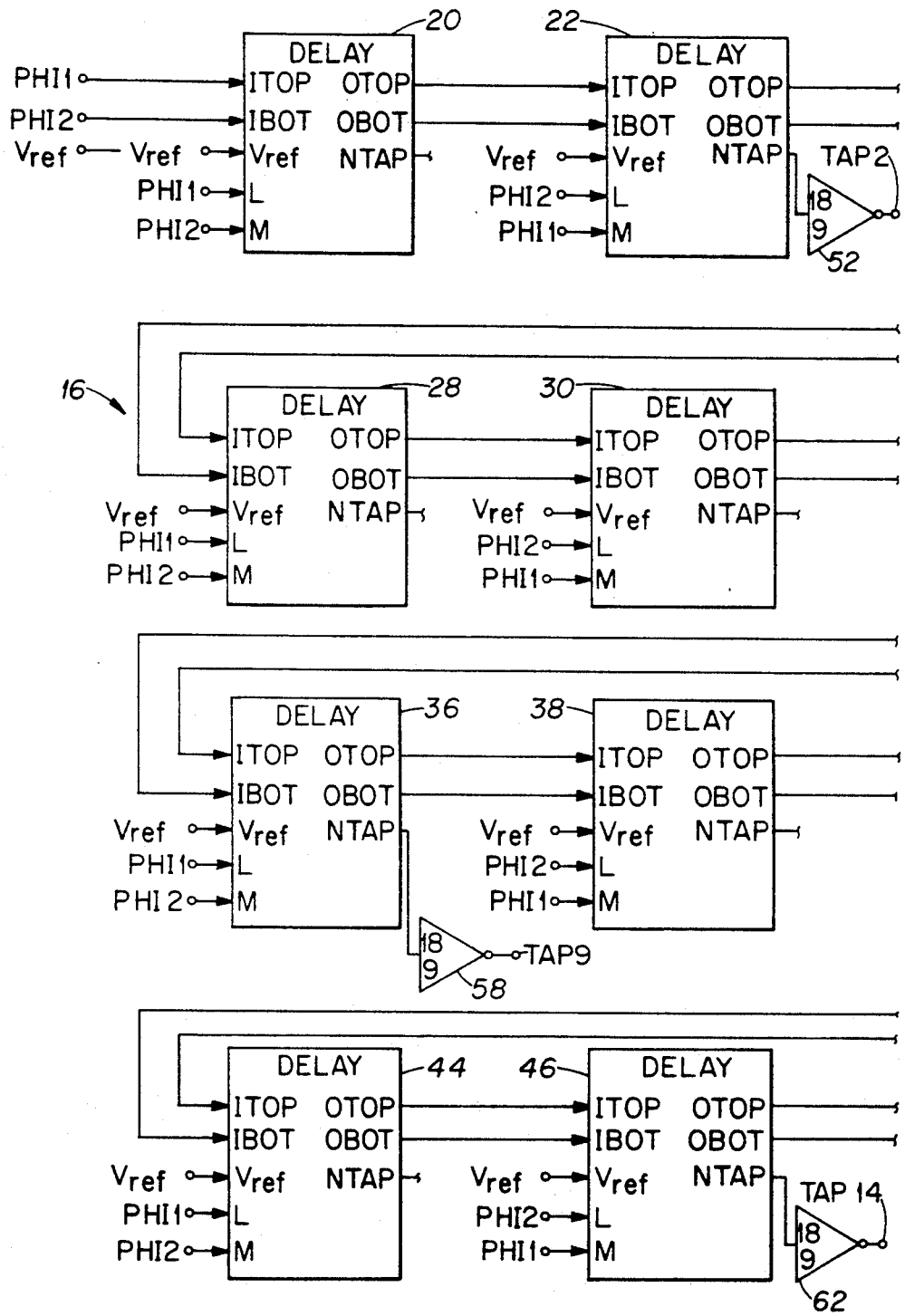
FIG. 3 is a block diagram of a multiple segment delay line that can be utilized in the apparatus of FIG. 1.
Figure 3:
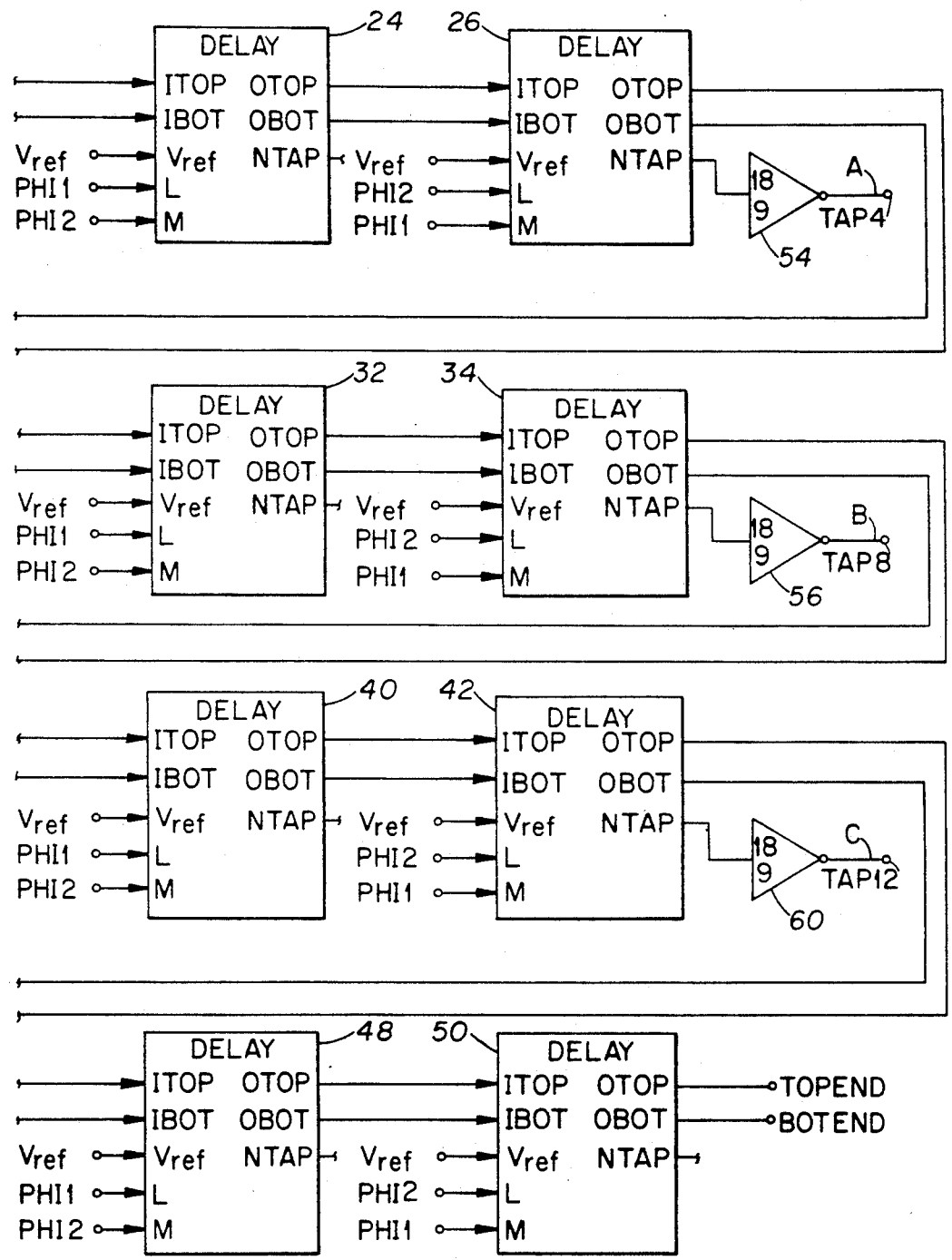

As shown in FIG. 3, delay line 16 includes a plurality of delay line segments 20-50. Each such delay segment has a top signal input ITOP, a top signal output OTOP, a bottom signal input IBOT, a bottom signal output OBOT, and an inverted tap signal output NTAP. Signals PHI1 and PHI2 are applied to inputs L and M (or M and L) of each delay segment, to select which output signal OTOP or OBOT is to be utilized to produce the tap signal at output NTAP. Each such delay segment produces a delay on signals received at the ITOP and IBOT inputs, which delayed signals are respectively produced at the OTOP and OBOT outputs. The value of this delay is controlled by the VREF input of the delay segment.

Figure 4:
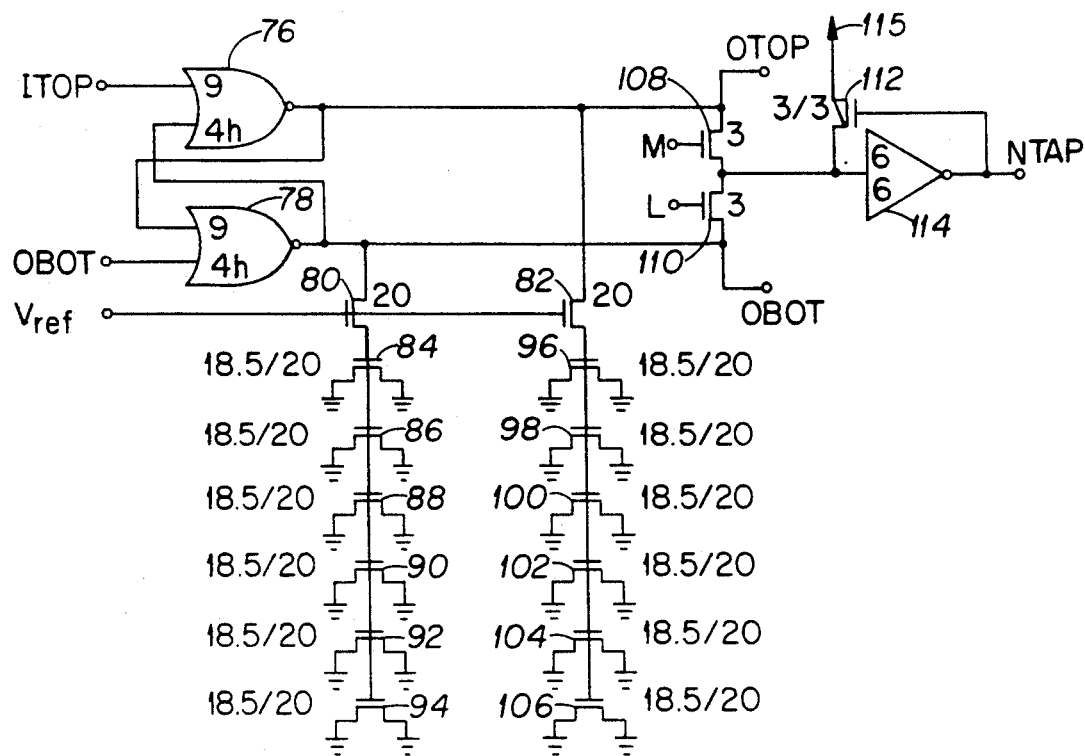
FIG. 4 is one embodiment of a delay line segment that can be utilized in the delay line of FIG. 3.
Figure 5:
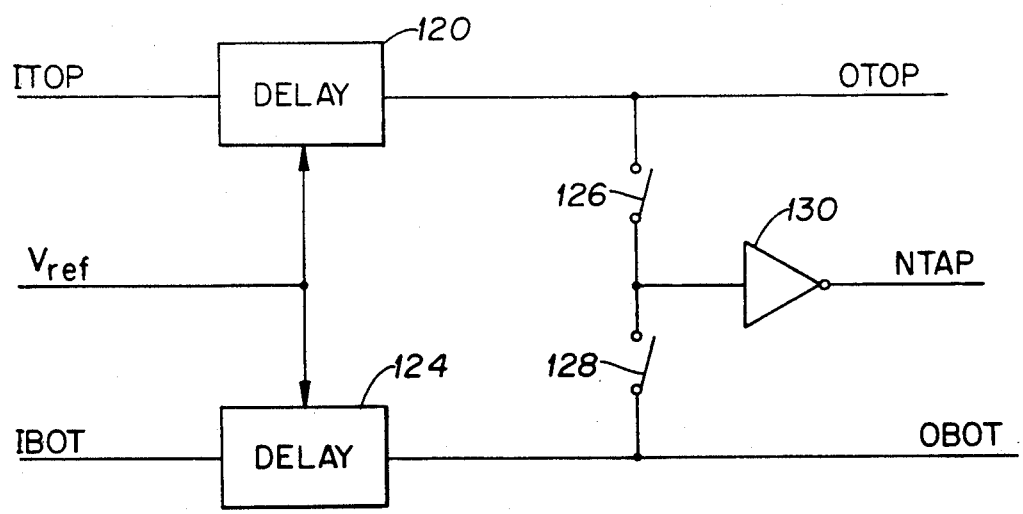
FIG. 5 shows another embodiment of a delay line segment that can be utilized in the delay line of FIG. 3.

Sixteen delay line segments are illustrated in FIG. 3 because in this embodiment it is desired to obtain four separately phased clock signals D, E, F, and G, as shown in FIG. 2. This is accomplished by obtaining output signals from certain delay line segments, or taps. In each case, the tap output is one of the top OTOP or bottom segment outputs, as selected by the state of the PHI1 and PHI2 signals. As shown in FIGS. 4 and 5, each delay line segment NTAP output produces a signal that has been inverted by inverter 114, so it is necessary to provide an additional respective inverter 52, 54, 56, 58, 60 or 62 at the NTAP output to provide an uninverted tap output signal. Tap signal A is produced by fourth segment 26 and inverter 54. Tap signal B is produced by eighth segment 34 and inverter 56. Tap signal C is produced by twelfth segment 42 and inverter 60. As shown in FIG. 2, where a clock signal CLK is provided, and it is desired to obtain four equal phases of that clock signal as output clock signals D, E, F, and G, this can be done by producing tap signals A, B, and C, each derived from the original clock input signal CLK. As shown in FIG. 1, clock output signals D, E, F, and G can be obtained by appropriately combining signals A, B, and C combinatorially. For example, this can be accomplished utilizing logic gates 64, 66, 68, and 70. Signal D is the inverse of signal A ANDed with the inverse of signal B ANDed with the inverse of signal C. Signal E is signal A ANDed with the inverse of signal B AND the inverse of signal C. Signal F is signal A ANDed with signal B ANDed with the inverse of signal C. Signal G is signal A ANDed with signal B ANDed with signal C. Alternatively, for the tap signals A, B, and C shown in FIG. 2, signal C need not be utilized for generation of output signals D and E, while signal C alone could determine output signal G, and tap signal A need not be utilized for generation of output signal F. Additional desired outputs may require additional taps.

As shown in FIG. 1, delay line 16 generates four other signals which are supplied only to phase detector 72. These are a tap signal TAP2 from second delay segment 22, a tap signal TAP9 from ninth delay segment 36, a tap signal TAP14 from fourteenth delay segment 46, and the output signal BOTEND from sixteenth delay segment 50. Phase detector 72 examines these signals for any phase or frequency error, and generates control signals PD, CD, NPU, and NCU to control delay line 16 and adjust the phase or delay. More specifically, output signals PD, CD, NPU, and NCU are provided to charge pump 18, which in response produces voltage control signal $V_{ref}$. Voltage control signal $V_{ref}$, which is provided to each segment 20-50 of delay line 16, controls the total delay through delay line 16.

As shown in FIGS. 3 and 4, each delay line segment 20-50 has two signal inputs ITOP and IBOT (top input and bottom input, respectively), and produces two delayed output signals OTOP and OBOT (top output and bottom output, respectively). As shown in FIG. 4, the two output signals OTOP and OBOT can be produced by two crossed NOR gates 76 and 78. As shown in FIG. 4, control voltage input $V_{ref}$ is applied to FETs (Field Effect Transistors) 80 and 82, which act as variable resistors. The source of FET 80 is connected to the output of NOR gate 78, while the source of FET 82 is connected to the output of NOR gate 76. Each of FETs 84–106 has its drain and source connected together, for example to ground. The gate of each of FETs 84–94 is connected to the drain of FET 80 while the gate of each of FETs 96–106 is connected to the drain of FET 82. Accordingly, FETs 84–106 act as capacitors between ground and the drains of FETs 80 and 82, respectively. In this manner, control voltage $V_{ref}$ controls the speed of operation, and thus the delay provided by, each delay line segment 20–50. In FIG. 4, $V_{ref}$ does so by controlling the resistances provided by FETs 80 and 82. Varying the resistance of the MOSFETs 80 and 82 varies the effective amount of capacitive loading from MOSFETs 84–94 and 96–106 respectively seen by NOR gates 76 and 78, thus controlling the delay. Increasing this resistance decreases the effective capacitive loading on NOR gates 76 and 78, thereby increasing speed of operation of the NOR gates, and decreasing the delay provided by the delay line segment.

Two other inputs to each segment 20–50 are signals PHI1 and PHI2. As shown in FIG. 2, these signals are provided alternately to inputs L and M, or M and L, of each delay line segment 20–50. In FIG. 4, the signal applied to input M is applied to the gate of FET 108, while the signal applied to input L is applied to the gate of FET 110. Since signal PHI1 is high when signal PHI2 is low and vice versa, only one of FETs 108 and 110 will be switched on at any time. Signals PHI1 and PHI2 if applied in the active state to FET 108 o FET 110 would turn that FET on. If FET 108 is turned on, then segment output signal OTOP is inverted and produced at the NTAP output of the segment. If FET 110 is instead switched on, then output signal OBOT is inverted and provided to the NTAP output of the segment.

The numbers (other than reference numerals) shown by each element in the Figures indicate their size. For example, FET 80 is labeled just with the number 20, which indicates a 20 micron wide transistor with the minimum channel length of 1½ microns and effectively of 0.85 microns. FET 84, which has two numbers, is indicated to be 18½ microns wide and 20 microns long, with a resulting effective length of 20−(1.5−0.85)=19.35. FETs drawn with an additional diagonal slash in the FET symbol, between drain and source (such as FET 112), are P-channel, while FETs drawn without that additional slash (such as FET 84) are N-channel. Gates are preferably implemented in CMOS. For example, NOR gate 76, which bears characters 9 and 4h, has a 9 micron wide P-channel transistor and a 4.5 micron wide N-channel transistor (the notation 4h meaning 4.5 or four and one-half). As another example, inverter 114, which bears characters 6 and 6, has a 6 micron wide P-channel transistor and a 6 micron wide N-channel transistor. An upwardly pointing arrow (e.g., 115) indicates a connection to supply voltage. A downwardly pointing unfilled triangle indicates a connection to ground. The particular component sizes are shown by way of example only; the invention is not to be construed as being limited thereto.

Alternatively, as shown in FIG. 5, a delay line segment can comprise any sort of voltage controlled delay 120 and 124, each controlled by an appropriate reference signal such as the common signal $V_{ref}$. Control switches 126 and 128, respectively controlled by the M and L inputs, are then used to determine which output signal OTOP or OBOT is provided to inverter 130 for the NTAP output. As one example, instead of crossed NOR gates 76 and 78, two pairs of inverters could be used, with each inverter in a pair connected in series, and each pair connected between the ITOP and OTOP, or IBOT and OBOT, ports.

The apparatus illustrated in FIG. 3 provides four-phase output signals. For an eight-phase output system, taps could be taken from each of second segment 22, fourth segment 26, sixth segment 30, eighth segment 34, tenth segment 38, twelfth segment 42, and fourteenth segment 46. Each such tap would then be provided both to logic for generating the output signals (using different logic than logic gates 64, 66, 68, and 70), and to phase detector 72 for detection of phase errors. Also, although sixteen segments are shown in FIG. 3, any number of segments could be used. For example, if four-phase output signals are desired by the user, then the number of delay line segments used could be any integral multiple of four. However, the number of segments to be used would also be determined by the maximum and minimum values for the voltage controlled delays through each delay line 16 segment 20–50. The choice of numbers of segments would be based primarily on the number of output phases desired by the user, and the limits of the individual delay elements or segments.

Figure 6:
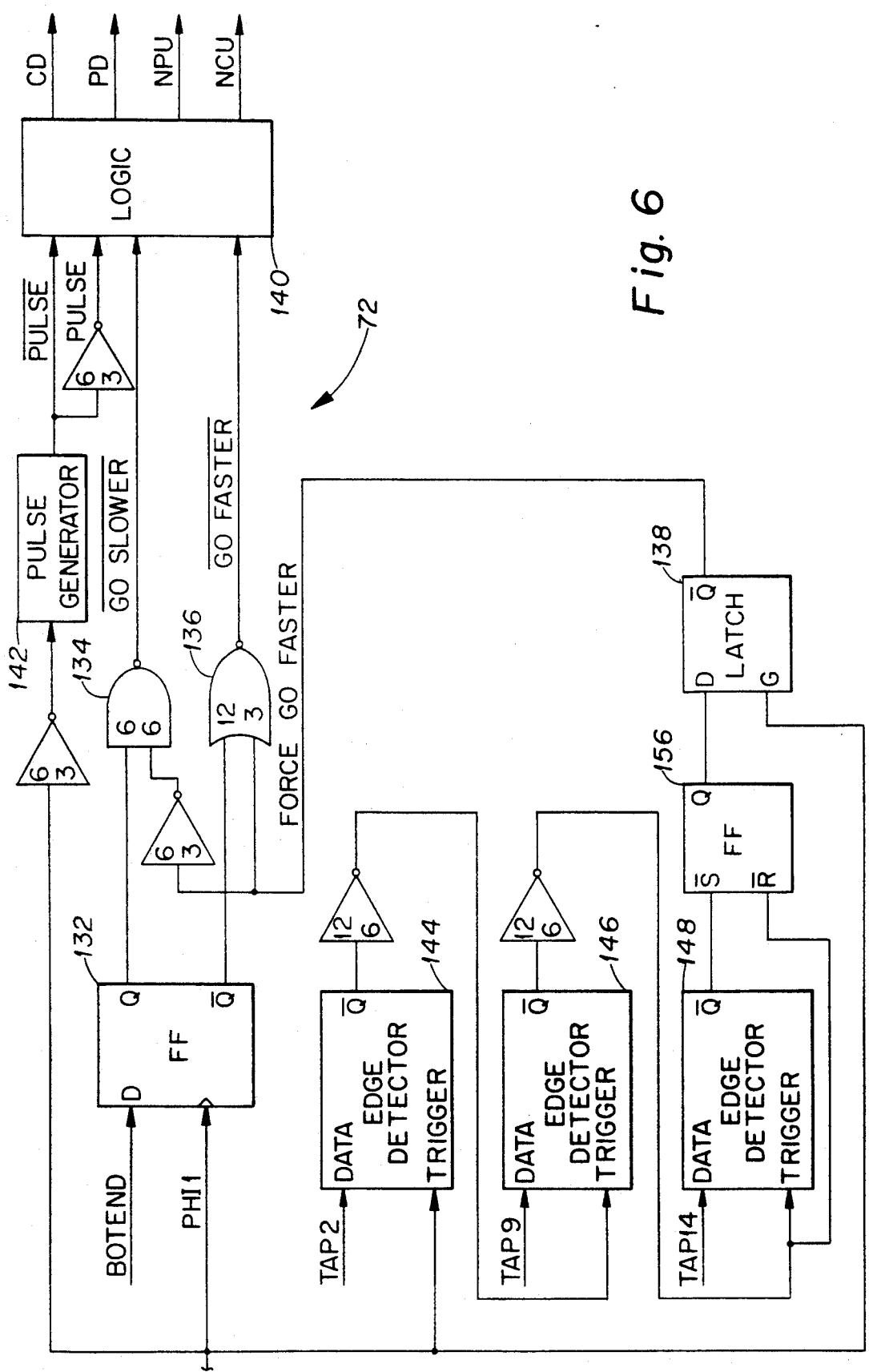
FIG. 6 shows a phase detector that can be utilized in the apparatus of FIG. 1.

Further detail on phase detector 72 is shown in FIG. 6. Segment 50 output BOTEND and divider output PHI1 are respectively provided to the data and trigger inputs of edge-triggered D type flip-flop 132. A true signal from the Q output of flip-flop 132, plus a false state for the FORCE GO FASTER signal from latch 138, causes a false-state output from NAND gate 134. The inverted GO SLOWER signal produced by NAND gate 134 is then held true or low. The not-Q output of flip-flop 132 is provided to one input of NOR gate 136. A logic true signal from the not-Q output of flip flop 132, and/or on the FORCE GO FASTER signal from latch 138, causes a false state output from NOR gate 136. The inverted GO FASTER signal produced by NOR gate 136 is then held true or low. Accordingly, if a rising edge of divided clock signal PHI1 triggers flip-flop 132 while segment 50 output signal BOTEND is high, then the inverted GO SLOWER signal will be active unless overridden by the FORCE GO FASTER signal from latch 138. Otherwise, the inverted GO FASTER signal will be active. Both the GO SLOWER signal and the GO FASTER signal are provided as inputs to logic 140. Also, an inverted PHI1 signal is provided to pulse generator 142. Pulse generator 142, in response to signal PHI1 becoming low, generates a single negative true output pulse. Pulse generator 142, upon receiving a rising edge, generates a pulse by NANDing the received signal with its delayed inverse. Pulse width is equal to that delay. However, any sort of pulse generator could be utilized as pulse generator 142. That pulse and its inverse are also provided to logic 140. Logic 140 generates appropriate levels for control signals CD, PD, NPU, and NCU, which are then provided to control charge pump 18. In response to on the state of signals CD, PD, NPU, and NCU, charge pump 18 will pump up, pump down, charge up or charge down.

Figure 7:
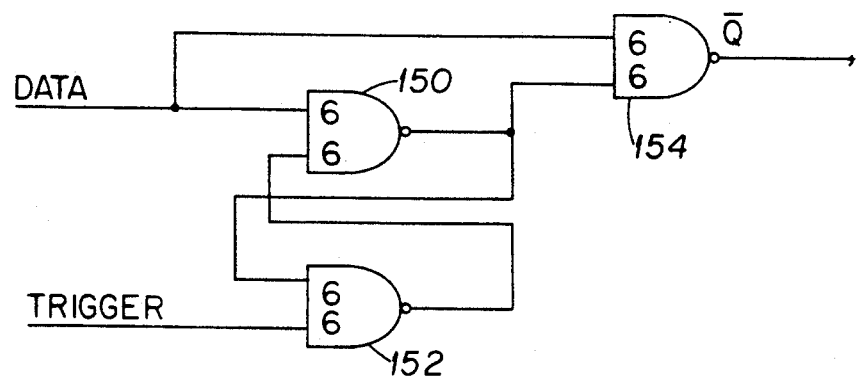
FIG. 7 shows an edge detector that can be utilized in the phase detector of FIG. 6

As discussed above, the GO SLOWER signal and the GO FASTER signal state can be controlled, and the output of flip flop 132 overridden, by inverting transparent latch 138, which generates the FORCE GO FASTER signal. Generation of that signal will now be described. Phase detector 72 also includes rising edge detectors 144, 146, and 148. Each such edge detector 144, 146, and 148 produces a low or true output signal upon detecting a rising edge on a certain signal, unless its trigger input is held low (false). Once such edge detector is shown in FIG. 7. As shown in FIG. 7, two NAND gates 150 and 152 are cross-coupled to in effect form a not-S, not-R single Q output flip-flop. The input signal on which a rising edge is to be detected is applied to one input of NAND gate 150 and to one input of NAND gate 154. A similar arrangement can be utilized as flip-flop 156 of FIG. 6. However, if the trigger signal applied to one input of NAND gate 152 is held low, then no edge of the input signal could be detected by the edge detector of FIG. 7. Alternatively, other edge detectors could be utilized as edge detectors 144, 146, and 148.

Edge detectors 144, 146, and 148 together determine whether a series of rising edges appear in a certain predetermined desired order, as a check on proper operation of segmented delay line 16. For the arrangement of FIG. 6, taps are obtained from three delay line 16 segments, and are checked for proper sequencing of rising edges within delay line 16. As shown in FIG. 3, signal TAP2 is obtained by inverting 52 the NTAP output of second segment 22. Signal TAP9 is obtained by inverting 58 the NTAP output of ninth segment 36. Signal TAP14 is obtained by inverting 62 the NTAP output of fourteenth segment 46. Signal TAP2 is provided as the input signal, and signal PHI1 is provided as the trigger signal, to edge detector 144. Signal TAP9 is provided as the input signal, and an inversion of the output of edge detector 144 is provided as the trigger signal, to edge detector 146. Signal TAP14 is provided as the input signal, and an inversion of the output of edge detector 146 is provided as the trigger signal, to edge detector 148. Accordingly, edge detector 146 will not indicate presence of any rising edge on its input signal TAP9 unless edge detector 144 first detects a rising edge on its input signal TAP2. Similarly, edge detector 148 will not detect any rising edge on its input signal TAP14 unless edge detector 146 first detects a rising edge on its input signal TAP9.

Divided clock signal PHI1 is applied to the G or clock input of transparent latch 138. While signal PHI1 is active (high), the output of latch 138 changes to pass data received. In that condition, the output not-Q of latch 138 is then equal to its data input D. While signal PHI1 is inactive (low), latch 138 holds its previous value, and its output not-Q is unchanged (not Q=not-Q) notwithstanding whatever may appear at its data input D. This is what is meant by latch 138 being "transparent". The output not-Q of latch 138 is updated to reflect its present data input D only while its clock input G is active or high. Edge detector 144 is triggered by signal PHI1 becoming active. Signal PHI1 becoming inactive closes latch 138. Thus, the output from edge detectors 144, 146 and 148 would not affect the output of latch 138 unless signal PHI1 remains active.

Accordingly, if rising edges are successively detected on signals TAP2, TAP9, and TAP14, in that order, while signal PHI1 remains true or high, then signal FORCE GO FASTER will not be held active. Failure to detect any of these edges, in the above order, indicates presence of a phase error of some odd integral multiple of 360°. To indicate and correct such error condition, signal FORCE GO FASTER is held active or true.

In FIG. 6, edges are detected on taps from second segment 22, ninth segment 36, and fourteenth segment 46. In lieu thereof, taps from any three delay line 16 segments could be utilized, with those taps being checked by corresponding edge detectors of phase detector 72 for rising edges in the order in which their corresponding segments appear in the delay line. However, first segment 20 and last segment 50 cannot be used for this purpose. This is because signal PHI1 is used to trigger first edge detector 144, so that an edge of signal PHI1 could be substantially simultaneous with an edge of a tap from either of these segments. Also, only two taps, and two edge detectors, instead of three could be effectively used for this purpose. Still, use of three (or more) taps and three (or more) edge detectors is preferred. For example, a tap could be obtained from each of fourth segment 26 and fourteenth segment 46. A computer simulation for this arrangement found that errors could be detected up to nine times 360°, but not eleven times and beyond. Also, a computer simulation involving taps from the fourth and eighth segments of a 16-segment delay line found that phase errors could be detected through nine times 360°, but not eleven times or beyond. Computer simulations of taps from the following pairs of segments of a 16-segment delay line were found to not provide detection of errors beyond ten times 360° phase error; 3 and 11, 2 and 13, 2 and 3, 2 and 5, and 2 and 14.

Logic 140 conditions the received pulse, GO SLOWER, and GO FASTER signals to produce control signals CD, PD, NPU, and NCU, such as to avoid overlapping generations, to work with charge pump 18. Logic 140 is shown in greater detail in FIG. 8. Transistors 174, 176, 178 and 180, and inverters 182 and 184, ensure that the inverted and noninverted PULSE signals are nonoverlapping. Thus, charge pump 18 does not charge (to null parasitic capacitance) while pumping (to change control signal $V_{ref}$).

Figure 9:
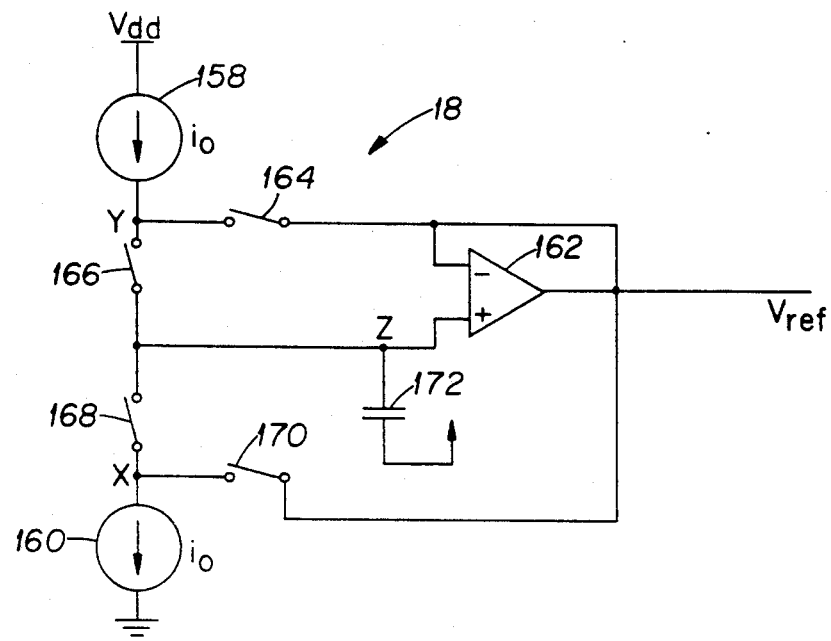
FIG. 9 is a generic block diagram illustration of a delay line charge pump and unity gain buffer that can be utilized in the apparatus of FIG. 1.
Figure 10:
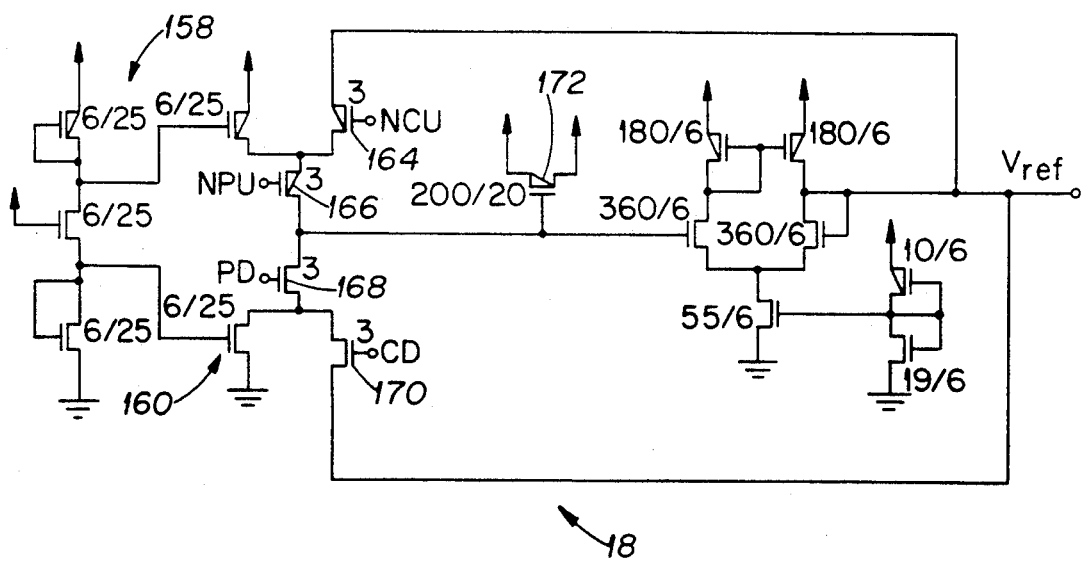
FIG. 10 shows one embodiment of the charge pump and buffer of FIG. 9.
Figure 11:
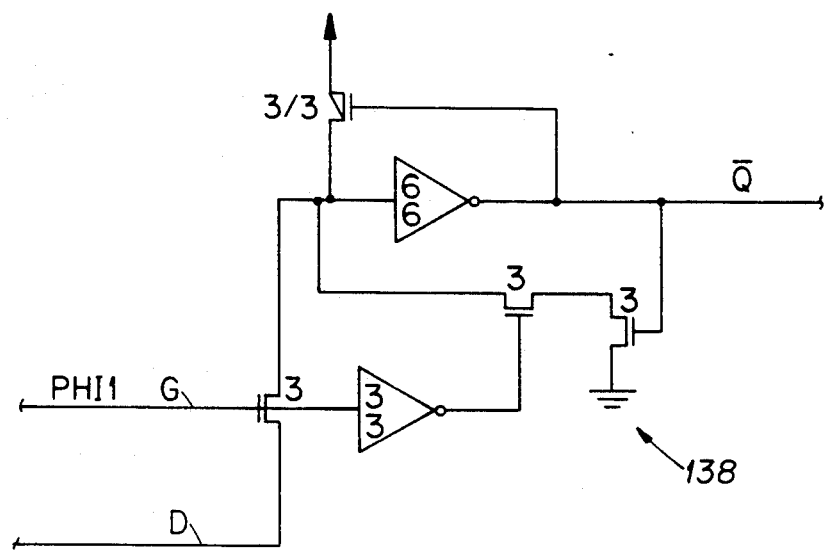
FIG. 11 shows one embodiment of the transparent latch of FIG. 6.

Charge pump 18 is shown in greater detail in FIG. 9. As shown in FIG. 9, charge pump 18 includes matched current sources 158 and 160, operational amplifier 162, and four controlled switches 164, 166, 168, and 170. Amplifier 162 is a simple operational amplifier connected in a unity gain configuration, as shown in FIG. 9. Each current source 158 and 160 produces a current $i_o$. Capacitor 172 can be connected between node Z, and supply voltage (as shown in FIGS. 9 and 10) or ground. When negative logic signal NCU is low or active, switch 164 is closed, and any parasitic capacitances in source 158, or elsewhere at node Y, charge to $V_{ref}$. When negative logic signal NPU is low or active, switch 166 is closed, and charge pump 18 pumps up. This means that the voltage drop across capacitor 172, and control voltage $V_{ref}$, are increased. When signal PD is high or active, charge pump 18 pumps down. The voltage across capacitor 172, and thus control voltage $V_{ref}$, are decreased. When signal CD is high or active, switch 170 is closed, charging to $V_{ref}$ any parasitic capacitances in source 160 and elsewhere at node X.

Figure 8:
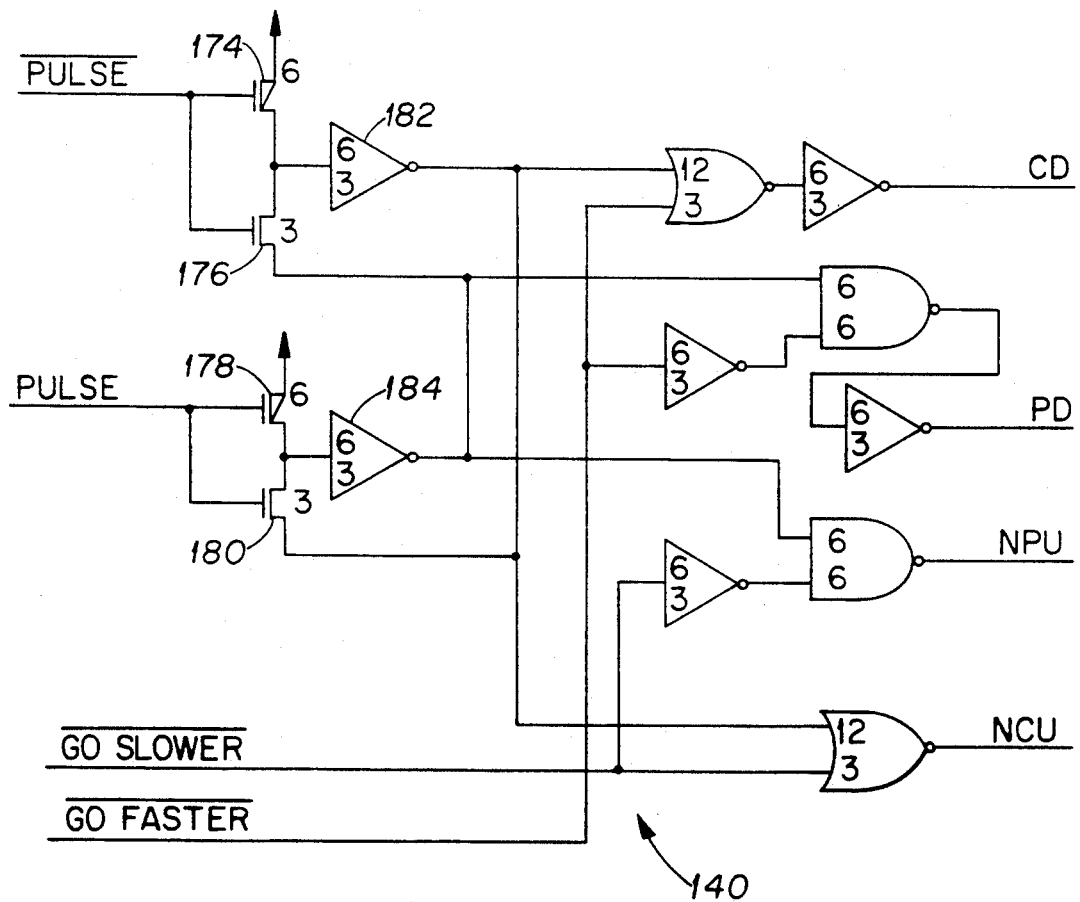
FIG. 8 shows logic for charge pump input signal generation that can be utilized in the phase detector of FIG. 6.

Signals NCU and CD are nonoverlapping complementary signals utilized to null out any parasitic effects in charge pump 18, particularly to discharge and effectively cancel parasitic capacitance of sources 158 and 160, especially when charge pump 18 is not pumping or changing control voltage $V_{ref}$. Otherwise, stored charge in such parasitic capacitance could charge capacitor 172, causing an erroneous change in control voltage $V_{ref}$. Johnson and Hudson, supra, at Section VI.

at pages 1221–1222 and FIG. 8, discusses the potential for error provided by parasitic capacitance of his current source, to which reference is hereby made. In addition, switches 166 and 168, when respectively implemented as MOS transistors, have parasitic capacitive coupling effects which are also nulled out by precharging nodes X and Y to $V_{ref}$. This precharging is accomplishing by closing switches 164 and 170.

One implementation of charge pump 18 is shown in FIG. 10.

Control voltage $V_{ref}$ is produced by charge pump 18 to control speed of delay line 16.

Figure 13:
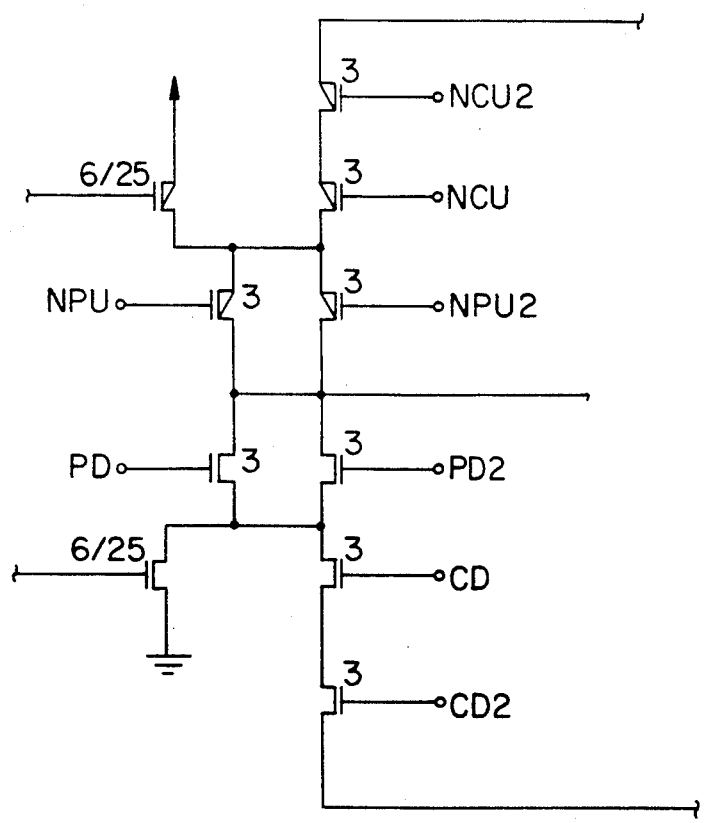
FIG. 13 shows a portion of an alternative embodiment of the charge pump, for inclusion in the apparatus of FIG. 12.
Figure 12:
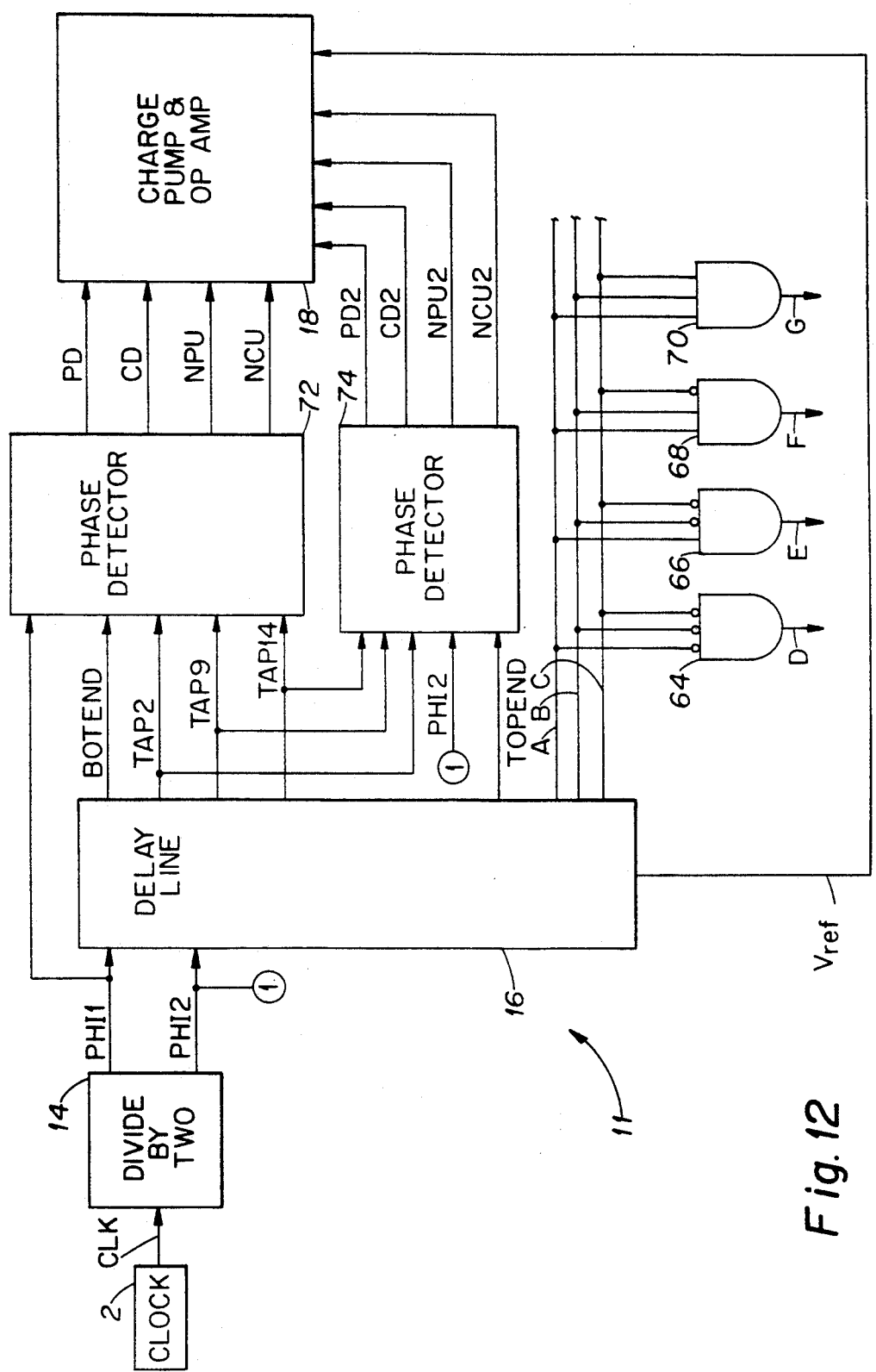
FIG. 12 is a block diagram of an alternative embodiment of a feedback controlled synchronous delay line.

Edge detectors 144, 146, and 148 are particularly intended to address output signal phase errors of odd integral multiples of the period of the original clock signal CLK. Even (as opposed to odd) integral multiples of the period of the clock signal CLK need not be considered by these edge detectors, for the following reason. Divider 14 produces two divided clock signals, PHI1 and PHI2. Both signals PHI1 and PHI2 are received by delay line 16. However, only one of these signals, PHI1, is received by phase detector 72. Accordingly, in effect, only half of delay line 16 (the half utilizing signal PHI1) is actually utilized to produce the various taps used for error detection. However, since phase detector 72 does not receive signal PHI2, phase and frequency error correction can be done every PHI1 cycle, or only about half the time (every other CLK cycle) that phase detector 72 is operating. To avoid this delay, and thus provide faster correction of phase and frequency errors, an additional phase detector 74 can be utilized. An alternative embodiment 11 of a synchronous delay line according to the present invention, including additional phase detector 74, is shown in FIG. 12. This additional phase detector 74 would be identical to the phase detector shown in FIGS. 6–8 and 11, except that, as shown in FIG. 12, instead of receiving divided clock signal PHI1, signal PHI2 would be received. Also, instead of receiving output signal BOTEND from the OBOT output of sixteenth delay segment 50, output signal TOPEND from the OTOP output of segment 50 would be received instead by the additional phase detector 74. In addition, as shown in FIG. 13, charge pump 18 would have to be modified to accommodate the additional control signals NCU2, NPU2, PD2, and CD2 produced by the additional phase detector. For each such additional signal, an additional transistor would be added to the charge pump configuration of FIG. 10 to accommodate each such additional signal. The additional transistor receiving NPU2 would be connected in parallel with the existing transistor receiving signal NPU. The additional transistor receiving signal PD2 would also be connected in parallel with the transistor receiving signal PD. The additional transistor receiving signal NCU2 would be connected in series with the transistor receiving signal NCU. The additional transistor receiving signal CD2 would be connected in series with the transistor receiving signal CD. Otherwise, operation of the additional phase detector 74 would be identical to the operation of phase detector 72 described above.

If the incoming clock signal stops, or if the analog component generating reference voltage $V_{ref}$ is shut down, then synchronous delay line 10 will cease operation. Upon resumption of such operation, there can be relatively significant delay in redetermining the appropriate level of reference voltage $V_{ref}$. To avoid such delay, in the apparatus of FIG. 14 the value of reference voltage $V_{ref}$ is in effect digitized and stored for use upon resumption of normal operation. Such insertion of a stored value of $V_{ref}$ into the feedback loop reinitiates operation with a value of reference voltage $V_{ref}$ that is reasonably close to the needed value. Such storage and provision of reference voltage $V_{ref}$ is provided by the apparatus of FIGS. 14–28.

Figure 14:
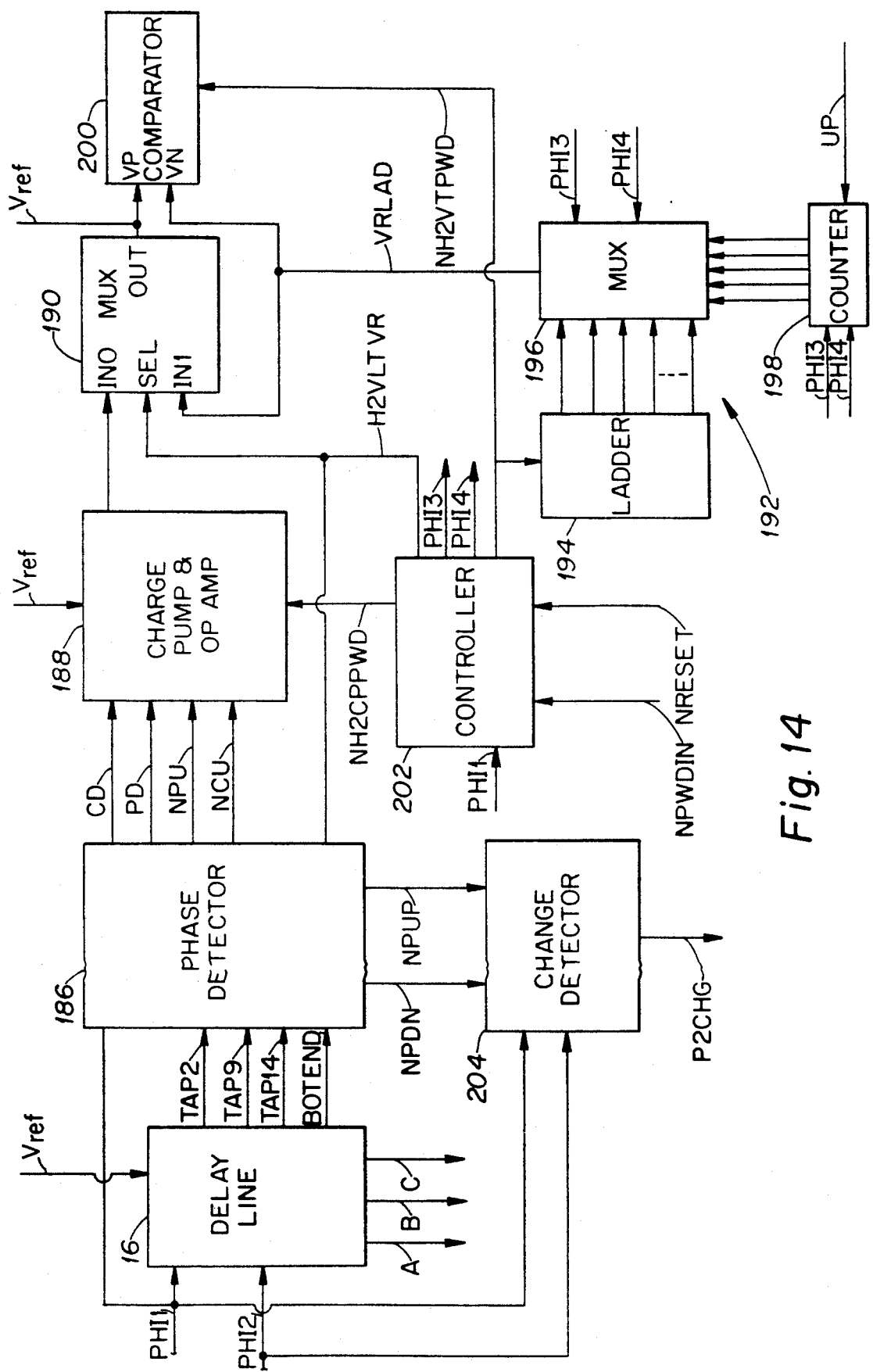
FIG. 14 is a block diagram of a portion of still another embodiment of a feedback controlled synchronous delay line according to the present invention.
Figure 27:
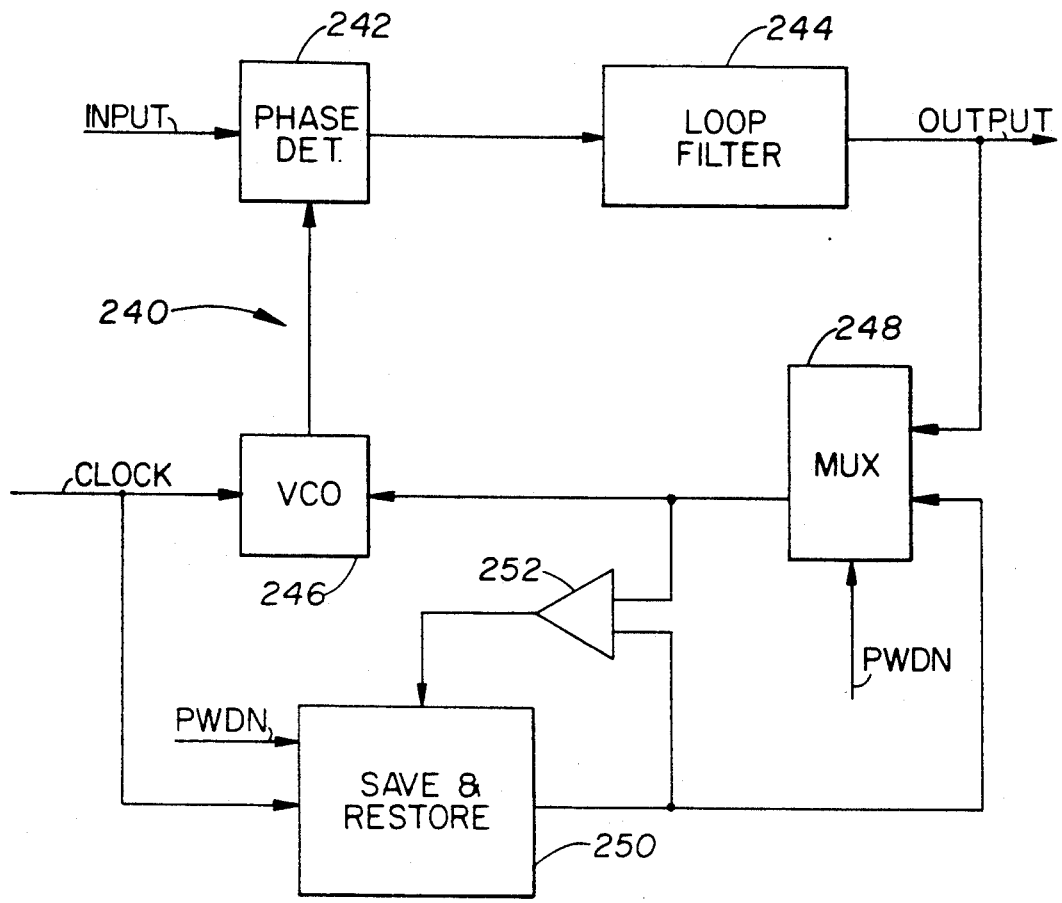
FIG. 27 is a block diagram of another embodiment of a feedback control system using a save and restore component to allow power reduction according to the present invention.
Figure 28:
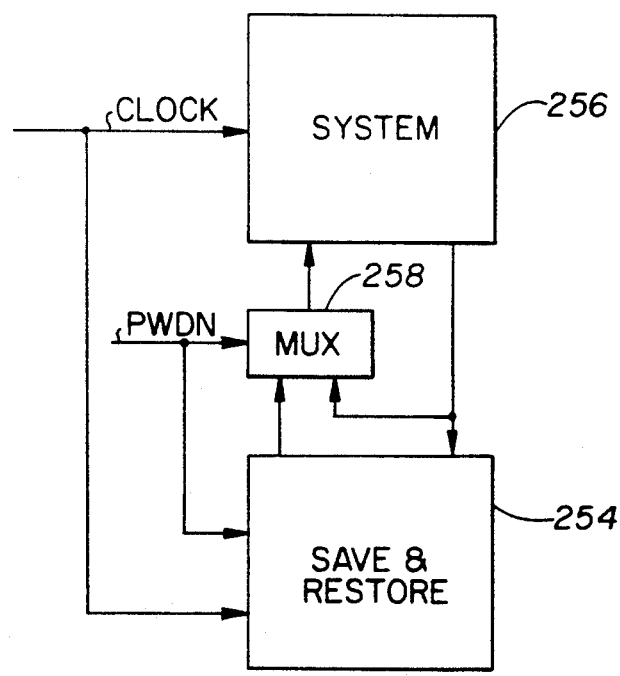
FIG. 28 shows another embodiment of a control system using a save and restore component to allow power reduction according to the present invention.

FIG. 14 shows a portion of the synchronous delay line of FIG. 1 with additional structure provided for storage and restoration of the operating value of reference voltage $V_{ref}$. However, such additional structure could also be utilized in the apparatus of FIG. 12, utilizing either or both of phase detectors 72 and 74. Also, certain portions of the apparatus of FIG. 14 could be utilized to save and restore the feedback control value for any feedback-controlled system, such as the phase locked loop of FIG. 27. Furthermore, as shown in FIG. 28, certain portions of the apparatus of FIG. 14 could be utilized to save and restore the control value for any signal-controlled system, such as the system shown in FIG. 28, even though that system may not be a feedback controlled system. Certain portions of the apparatus of FIG. 14 could also be utilized in the above described systems of Bazes and of Johnson and Hudson. However, for purposes of the following discussion, it will be considered that the structure of FIG. 14 forms part of the apparatus of FIG. 1.

In FIG. 14, divided clock signals PHI1 and PHI2 are provided to delay line 16, which also receives reference voltage $V_{ref}$. Tap signals TAP2, TAP9, and TAP14, respectively produced by second delay unit 22, ninth delay unit 36 and fourteenth delay unit 46, are produced by delay line 16 and provided to phase detector 186. Output bottom signal OBOT from delay unit 50 is also provided to phase detector 186 as signal BOTEND. Phase detector 186 also receives divided clock signal PHI1. In response to those signals, phase detector 186 provides control signals PD, CD, NPU, and NCU to charge pump and operational amplifier 188. Operation of phase detector 186 is similar to that of phase detector 72 of FIG. 1. Operation of charge pump and op amp 188 is similar to that of charge pump and op amp 18 of FIG. 1. In each case, differences are discussed below. During normal operation, the signal produced by charge pump and op amp 188 would be utilized as reference voltage $V_{ref}$. That output signal is provided to two-to-one multiplexer 190. The output of multiplexer 190 provides reference voltage $V_{ref}$ as feedback control to delay line 16 and to charge pump and op amp 188.

Figure 15:
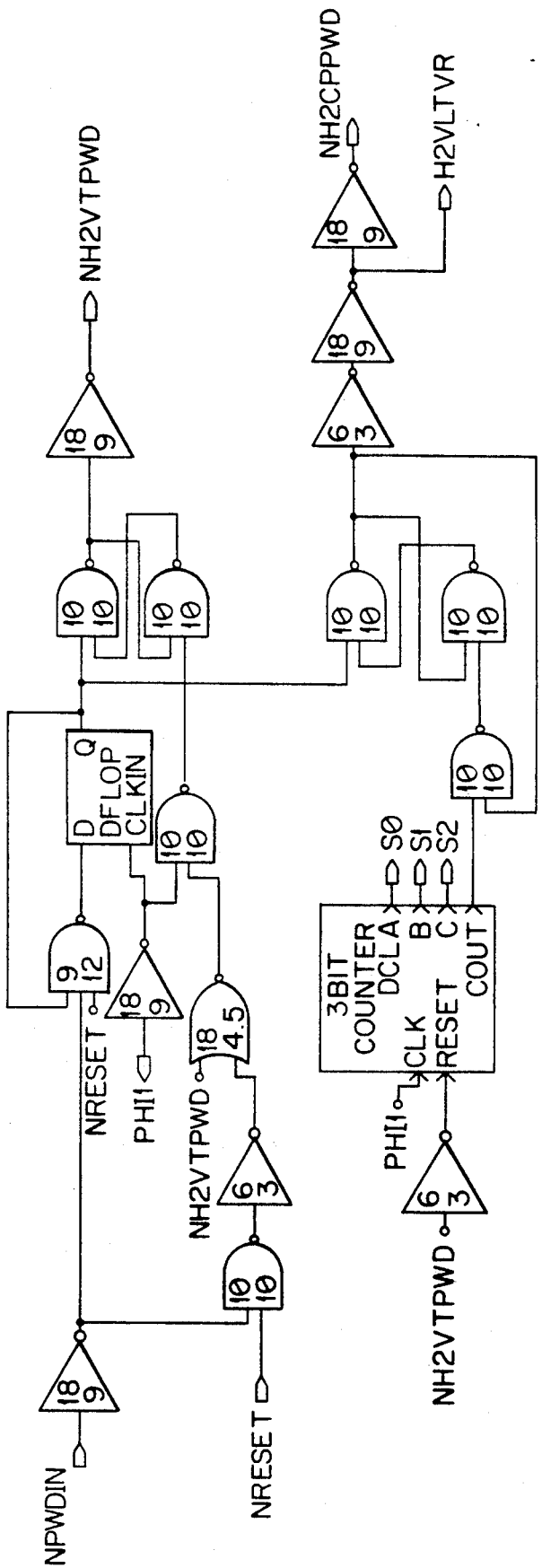
FIG. 15 is a block diagram of a portion of a controller that can be utilized in the apparatus of FIG. 14.
Figure 16:
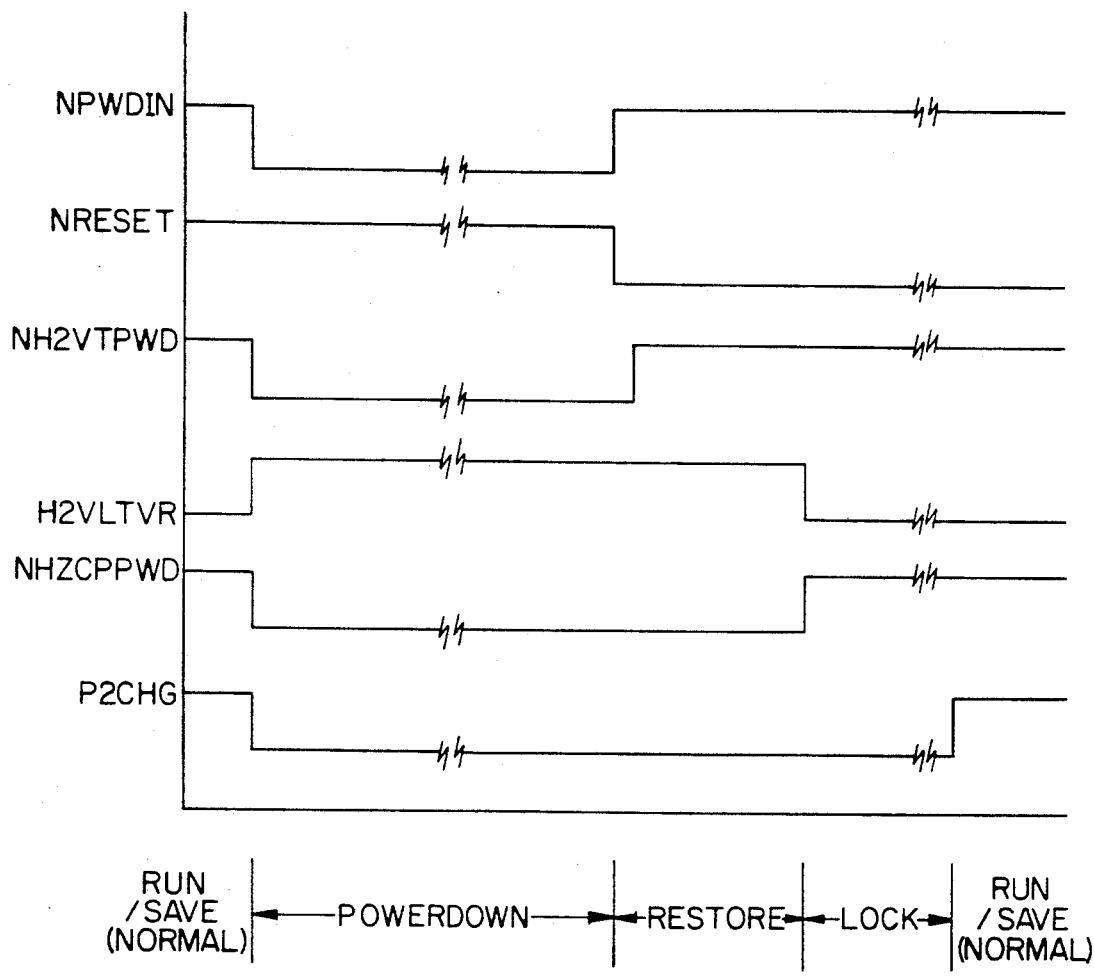
FIG. 16 is a waveform timing diagram for signals that can be received, signals that can be within, and signals that can be produced by the apparatus of FIGS. 14 and 15.
Figure 17:
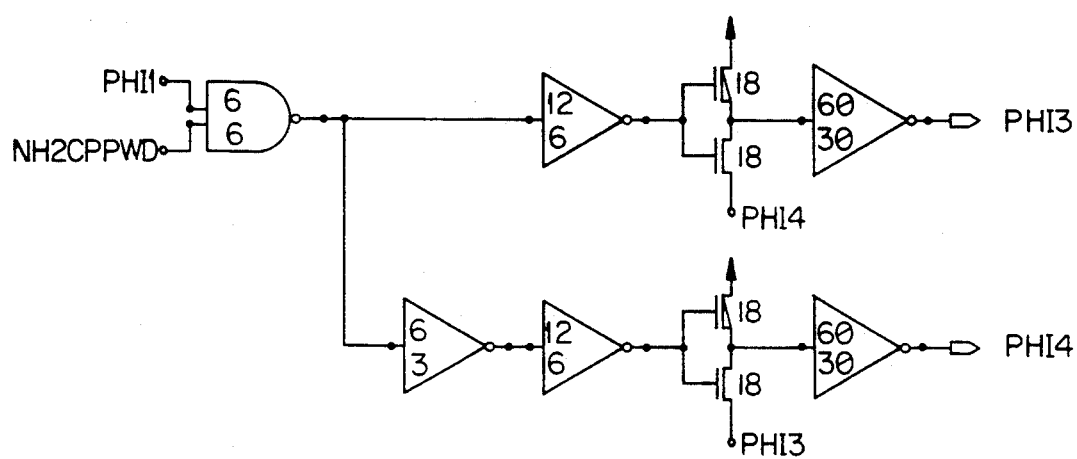
FIG. 17 is a block diagram of a second portion of a controller that can be utilized in the apparatus of FIG. 14.

The apparatus of FIG. 14 also includes save/restore component 192. Save/restore component 192 includes resistor ladder 194, multiplexer 196 receiving the divided signals from resistor ladder 194, counter 198 controlling multiplexer 196, comparator 200 controlling counter 198, multiplexer 190 receiving the outputs of charge pump and op amp 188 and multiplexer 196, and controller 202 controlling multiplexer 190 resistor ladder 194, comparator 200 and charge pump and op amp 188. Such control by controller 202 is based on received control signals NPWDIN and NRESET. Input control signals NPWDIN and NRESET respectively indicate whether to enter or exit a low power mode for the system, and whether a system wide reset which overrides that mode has occurred. In response to input control signals NPWDIN and NRESET, controller 202 produces control signals NH2VTPWD, NH2CPPWD, and H2VLTVR, as shown in FIGS. 15 and 16. As can be seen in FIG. 15, signal NH2CPPWD is the inverse of signal H2VLTVR. As shown in FIG. 17, controller 202 also produces clock signals PHI3 and PHI4 in response to divided clock signal PHI1 and control signal NH2CPPWD. However, it is preferred that signal PHI1 be buffered before its provision to the apparatus of FIG. 17.

Comparator 200 is provided with the signals produced by multiplexer 190 and multiplexer 196. If enabled by control signal NH2VTPWD from controller 202, comparator 200 compares the respective output signals of multiplexer 190 and multiplexer 196, and produces comparison signal UP. Signal UP serves as an up/down control signal for counter 198. Signal UP is made high to increment counter 198 when the output of multiplexer 196 has a value less than that of the output of multiplexer 190. Otherwise, counter 198 is decremented. During normal operation, multiplexer 190 would produce the output of charge pump and op amp 188 as reference voltage $V_{ref}$. Clock signals PHI3 and PHI4 received by counter 198 determine the frequency of such update of counter 198. Counter 198 determines which input to multiplexer 196 appears on the output of that multiplexer. The value of the counter 198 is a digital output which is stored and provided to the analog signal VRLAD, which represents the last Vref signal determined before a low power mode was entered. A change in the value of counter 198 results in a change in the selected input to multiplexer 196. In the apparatus of FIG. 14, incrementing counter 198 causes multiplexer 196 to change its selection of resistor ladder 194 output lines to an output line with an increased value, and decrementing the counter likewise would cause selection of a decreased value. Alternatively, a larger count value of counter 198 could cause selection of a lower resistor ladder 194 output value. During the low power mode and also when restoring the reference voltage $V_{ref}$ while recovering from the low power mode, comparator 200 is disabled by signal NH2VTPWD from controller 202, since the value of reference voltage $V_{ref}$ is not reliable and no comparisons are necessary. Thus, no power is wasted in comparator 200 when the apparatus is in low power mode. Initially during reduced power mode or loss of the incoming clock signal CLK, resistor ladder 194 would be disabled by a CMOS switch 213 controlled by signal NH2VTPWD from controller 202, for the same reason. During recovery from the low power mode, multiplexer 190 would pass through the output signal VRLAD of multiplexer 196 as reference voltage $V_{ref}$, thus restoring reference voltage $V_{ref}$ to its saved value, since charge pump and op amp 188 would not then have a reliable output for that purpose. However, as shown in FIG. 16, the rising edge of signal NH2VTPWD occurs before that of signal NH2CPPWD, so that ladder 194 is re-enabled while charge pump and op amp 188 is disabled and multiplexer 190 selects the ladder output. Therefore, during the time between a rising edge of signal NH2VTPWD and the successive rising edge of signal NH2CPPWD, the ladder 194 output signal VRLAD from multiplexer 196 is selected by multiplexer 190, and comparator 200 generates signal UP to adjust counter 198. However, signal UP does not yet increment nor decrement counter 198, because clock signals PHI3 and PHI4 are still disabled by signal NH2CPPWD, as shown in FIG. 17. Any voltage or current divider could be utilized in lieu of resistor ladder 194.

Figure 20:
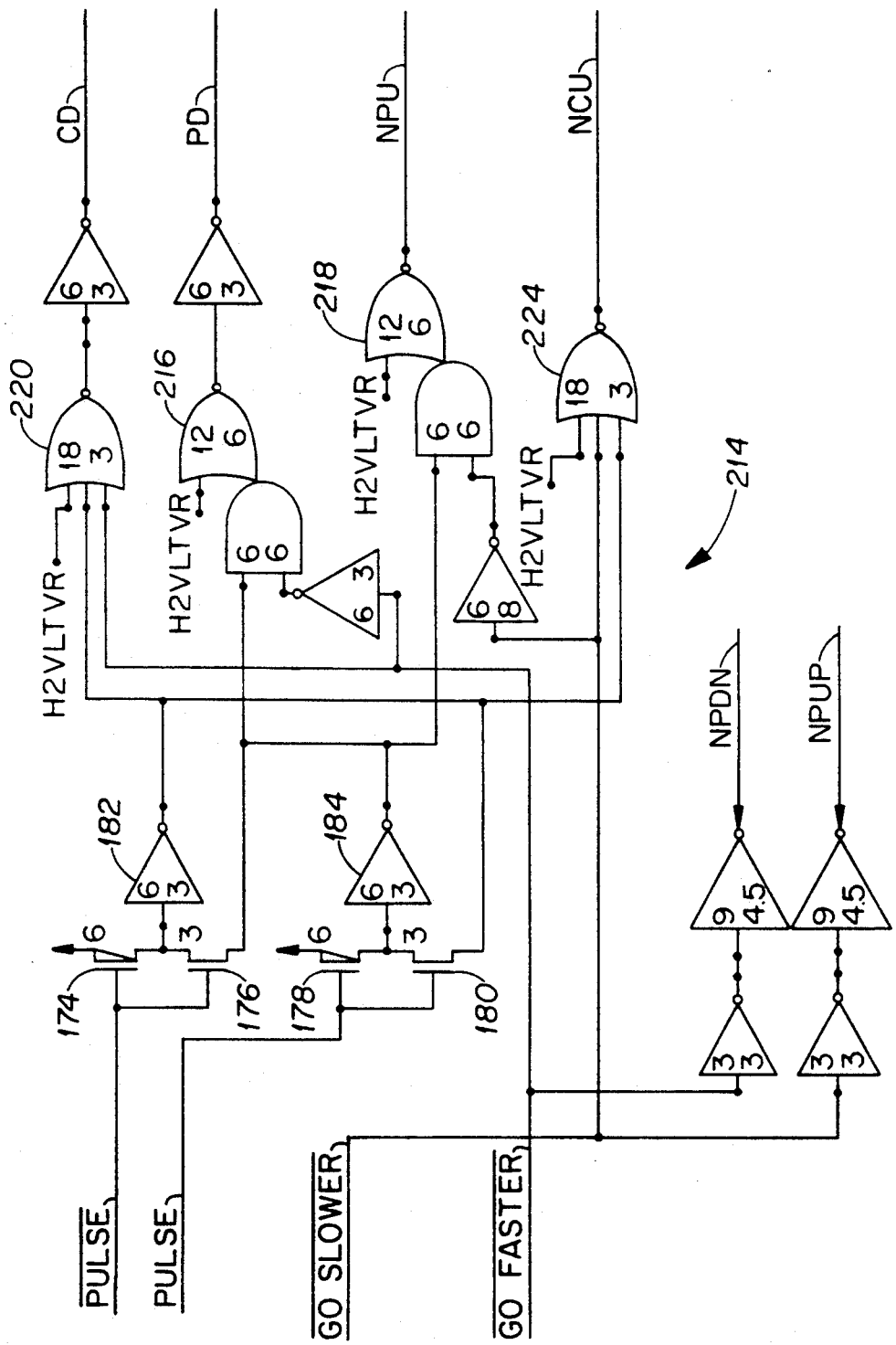
FIG. 20 shows logic for charge pump signal generation that can be utilized in the phase detector of FIG. 19.

Change detector 204 receives from phase detector 186 signals NPDN and NPUP. As shown in FIG. 20, signal NPDN corresponds to signal GO FASTER, while NPUP corresponds to signal GO SLOWER, each with buffering. When signal GO FASTER and signal GO SLOWER have each changed, this indicates that the apparatus of FIG. 14 has recovered from a power down mode, and locked to the incoming clock signal CLK. Such recovery would be reflected in signal P2CHG produced by change detector 204.

Relative timing of certain of the above-described control signals is illustrated by FIG. 16. Power down mode is entered with a falling edge of signal NPWDIN. A falling edge of signal NH2VTPWD, a falling edge of signal NH2CPPWD (and thus a rising edge of signal H2VLTVR) and a falling edge of signal PH2CHG, preferably occur 1 clock signal CLK cycle thereafter. Power reduced mode is exited with a rising edge of signal NPWDIN or a falling edge of signal NRESET. A rising edge of signal NH2VTPWD, indicating a full power condition, preferably occurs 1 clock signal CLK cycle after a rising edge of NPWDIN or a falling edge of signal NRESET, whichever occurs first after a falling edge of signal NPWDIN. A rising edge of signal NH2CPPWD (and thus a falling edge of signal H2VLTVR) preferably occurs 8 clock signal CLK cycles after such a rising edge of signal NH2VTPWD. The number of 8 cycles is selected for complete re-enabling and settling of resistor ladder 194 after the rising edge of signal NH2VTPWD; this number may vary with the requirements of the particular ladder or other divider used. In this embodiment, a rising edge of signal P2CHG occurs from 16 to 200 clock signal CLK cycles after that rising edge of signal NH2VTPWD, depending on how accurate the saved value of reference voltage $V_{ref}$ is and how long it takes delay line 10 to lock. However, the foregoing numbers of cycles are preferred for this embodiment, and can be altered as needed.

Figure 18:
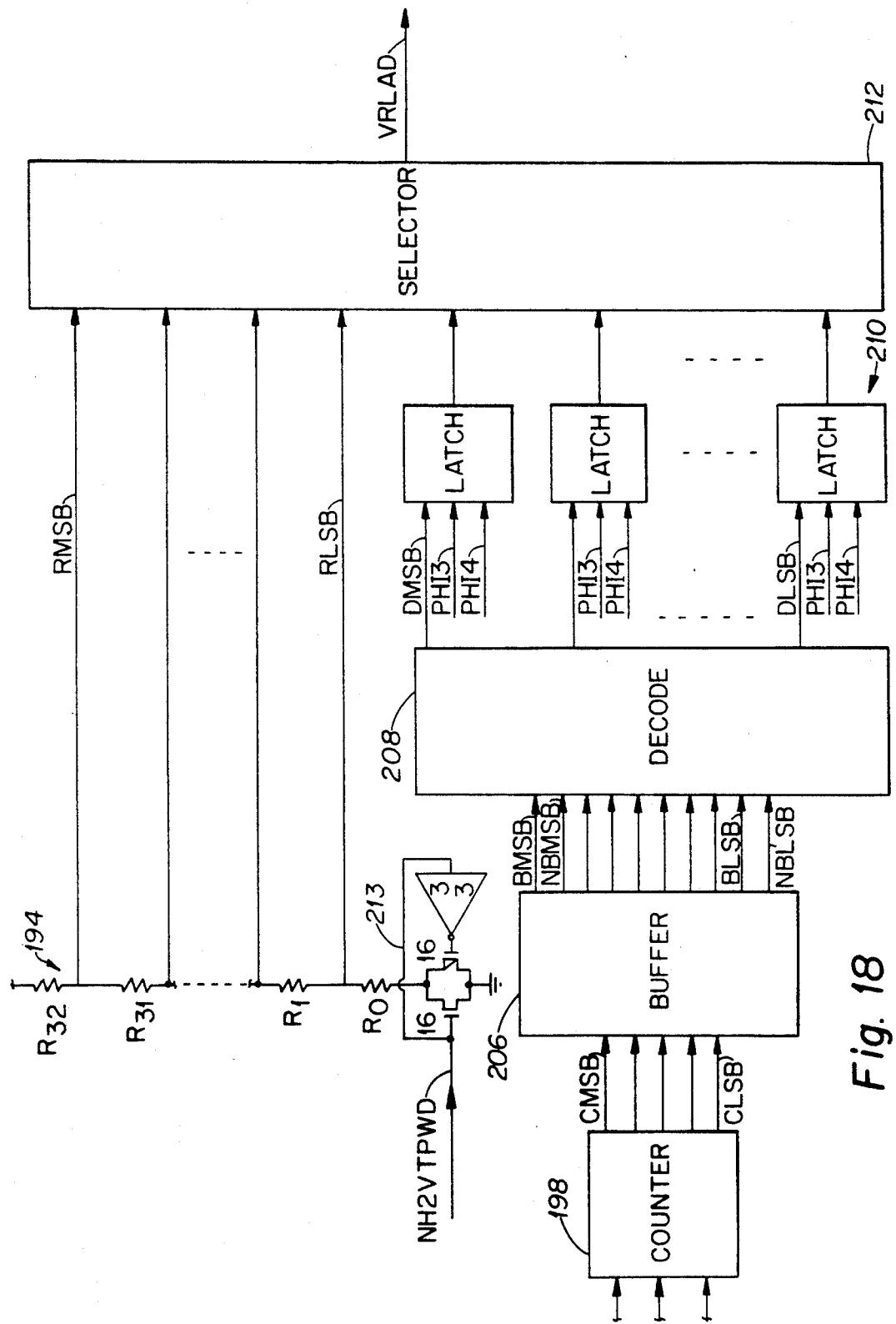
FIG. 18 is a block diagram of a save and restore component can be utilized in the apparatus of FIG. 14.

Save/restore component 192 is shown in greater detail in FIG. 18. Although resistor ladder 194 is shown here as a 32 step resistor ladder having 32 output lines, and although counter 198 is accordingly here shown as a 5-bit binary counter ($2^5 = 32$), these values are merely illustrative, and the invention is not to be construed as being limited thereto. Counter 198 is a 5-bit binary up/-down counter, clocked by clock signals PHI3 and PHI4, and incremented or decremented once each such clock cycle according to the state of up/down signal UP. Counter 198 can for example include four full adders and five clocked D-type latches or flip-flop, with each such latch or flip-flop producing one of the five parallel output bits. The latch producing the least significant bit would then receive, as its data input, its own output inverted. One of the full adders would then be utilized for each of the remaining four count bits, with the adder for the most significant bit not having a carry-out, and with the sum output of each such full adder being provided to the data input of the data latch for the corresponding count bit. The inverse of signal UP would be provided as one addend input to each of the full adders, with the other addend being provided by the corresponding count bit output of the corresponding data latch, and the carry input being provided by the carry output of the full adder for the next lower significant bit. The carry input for the full adder for the next-to least significant bit would be provided by the output for the least significant bit. However, any conventional 5-bit binary up/down counter could be utilized as counter 198.

Resistor ladder 194 includes, for 32 outputs, a string of 33 resistors $R_{32}-R_0$ connected in series, with an output being provided at the connection between each adjacent pair of resistors in that string. One end of the resistor string would be connected to the supply voltage. Connected between the other end of the string and ground is a CMOS switch 213 controlled by signal NH2VTPWD. For this embodiment, each of the 33 resistors has the same resistance, to provide equally spaced successive steps between the 32 outputs. However, any number of resistors, with regular or uneven resistance spacing between the lines, could be used in resistor ladder 194. Furthermore, any voltage or current divider could be used in lieu of resistor ladder 194 to produce the desired multiple outputs.

Multiplexer 196 includes buffer 206, 5-to-32 decoder 208, a plurality (here, 32) of clocked transparent latches (one for each decoder output) 208, and a 32-to-1 selector 210 controlled by plurality of latches 208. Buffer 206 amplifies the count bit outputs of counter 198 for easier utilization by the rest of multiplexer 196. Buffer 206 receives the binary count signals from counter 198. Decoder 208 receives the buffered count signals from buffer 206 and decodes the binary coded count signals into individual lines, with only the single line indicated by the binary count being held active. Decoder 208 thereby decodes the five binary coded count bits into 32 control lines. One could expand this code to six bits to control up to 64 control lines, or instead use four bits to control up to 16 control lines, etc. The values of these 32 control lines are retained by clocked plurality of latches 210. Preferably, one latch is provided for each output line of decoder 208. However, any multiple-bit register could be used in place of the plurality of latches 210. Because latches 210 and counter 198 have a common clock, latches 210 are updated each time that counter 198 is updated. Latches 210 only change value (assuming an output value change of counter 198) when clock signal PHI4 is high. Transparent latches 210 are utilized to deglitch the decoder 208, and delay the 32-bit output to the proper phase of the clock because it is desired to have the output change every time signal PHI4 rises to avoid glitches. Since only one of the parallel signals produced by decoder 208 is high or active, only one of the latches 210 outputs are active. For example, buffer 206 can produce a buffered true and a buffered inverted output for each of the counter 198 outputs, and decoder 208 can include 32 5-input NAND gates with inverted outputs, with each of the NAND inputs being connected to a corresponding one of the buffered counter outputs, either inverted or noninverted, depending on the decoded value to be represented by the output of the particular NAND gate. For example, for the LSB NAND gate, each of the buffer counter inputs to the NAND gate would be inverted, while for the MSB NAND gate each of the inputs to that NAND gate would be uninverted.

An alternative version of save/restore component 192 is illustrated in FIG. 18A. The apparatus of FIG. 18A differs from the apparatus of FIG. 18 chiefly in that a current divider, namely current ladder 270, is substituted for resistor ladder 194. Since a current divider such as current ladder 270 produces an output current, while signal VRLAD of FIG. 18 is a voltage, an appropriate converter, such as op-amp converter 272, is added at the output of selector 212 so that an output voltage signal is produced as signal VRLAD. Alternatively, such a converter could instead be interposed at each output of current ladder 270. Current ladder 270 is shown in greater detail in FIG. 18B, which illustrates a current ladder controlled by signal NH2VTPWD. Although current ladder 270 (like resistor ladder 194) is there illustrated as a 32 step resistor ladder having 32 output lines, and although counter 198 is accordingly again here shown as a 5-bit binary counter ($2^5=32$), these values are merely illustrative, and the invention is not to be construed as being limited thereto. Operation of the apparatus of FIG. 18A is otherwise similar to operation of the apparatus of FIG. 18 as described in the three preceding paragraphs.

Figure 19:
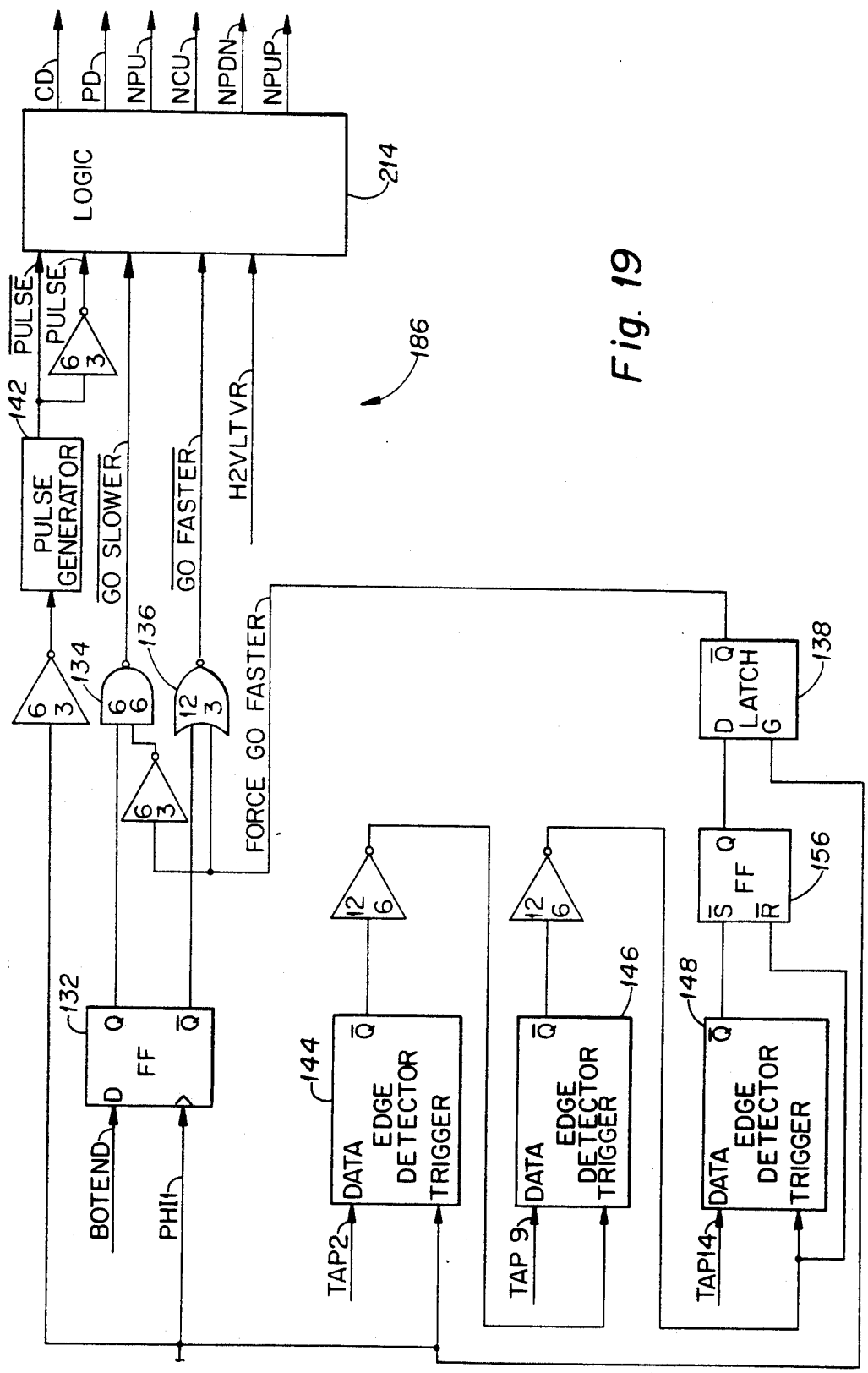
FIG. 19 shows a phase detector according to the present invention that can be utilized in the apparatus of FIG. 14.

Phase detector 186 of FIG. 14 is illustrated in greater detail in FIG. 19. As can be seen from a comparison of FIGS. 6 and 19, phase detector 72 and phase detector 186 are identical in structure and in operation, with the following exception. While phase detector 72 of FIG. 6 includes logic 140 generating signals CD, PD, NPU and NCU, phase detector 186 of FIG. 19 includes, at a corresponding location, logic 214 receiving signal H2VLTVR and generating signals CD, PD, NPU, NCU, NPDN and NPUP. Logic 214 is shown in greater detail in FIG. 20. As can be seen from a comparison of logic 140 of FIG. 8 and logic 214 of FIG. 20, many similarities in structure and operation are evident. However, logic 214 is provided with two additional NOR gates 216 and 218 so that signal H2VLTVR can be applied to the signal PD and signal NPU outputs. Signal H2VLTVR is applied to the signal CD and signal NCU outputs by providing an additional input to the corresponding NOR gates 220 and 224 for those signals. The practical effect of this introduction of signal H2VLTVR in logic 214 is that, during partial shutdown, that signal will be high. A high signal applied to an input of each of NOR gates 216, 218, 220 and 224 will close those gates to each produce a low signal. As a result, during partial shutdown, signals CD and PD will be held high, and negative logic signals NPU and NCU will be held low. In charge pump and op amp 188, switches 164, 166, 168 and 170 will thereby be held closed, effectively disabling charge pump and op amp 188 during partial shutdown and restoration of reference voltage $V_{ref}$. This also forces the storage capacitor 172 to be restored to the stored value of reference voltage $V_{ref}$. During normal operation, signal H2VLTVR is low, and so would not affect the output of any of NOR gates 216, 218, 220 and 224, so that signals CD, PD, NPU and NCU would not be affected.

Also, logic 214 generates signals NPDN and NPUP. As can be seen from FIG. 20, signal NPDN is a buffered form of signal GO FASTER, while signal NPUP is a buffered form of signal GO SLOWER. Signals NPDN, NPUP, PHI1 and PHI2 are provided to change detector 204.

Figure 21:
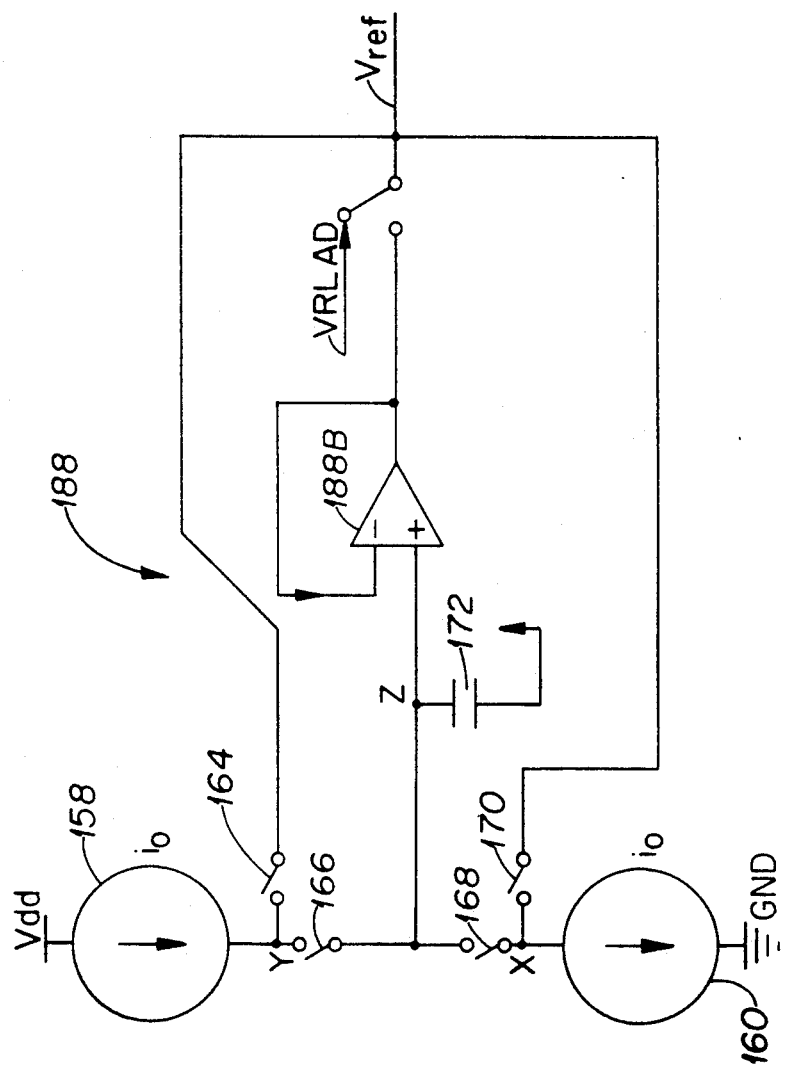
FIG. 21 is a generic block diagram illustration of a delay line charge pump, unity gain buffer and multiplexer that can be utilized in the apparatus of FIG. 14.

Charge pump and op amp 188, and multiplexer 190, are illustrated generically in FIG. 21. For simplicity of illustration, introduction of control signal NH2CPPWD to charge pump and op amp 188 is not illustrated, although same is shown in corresponding FIGS. 14 and 22. As can be seen from a comparison of FIGS. 9 and 21, structure and operation of charge pump and op amp 18 and charge pump and op amp 188 are similar, except as follows. Charge pump and op amp 188 can be shut down by operation of control signal NH2CPPWD. Also, the feedback of reference voltage $V_{ref}$ in charge pump and op amp 188 now takes place via multiplexer 190, and not directly. Multiplexer 190 is inserted in this feedback loop at the output of charge pump and op amp 188 to determine whether the output of charge pump and op amp 188, or of multiplexer 196, is to be utilized as reference voltage $V_{ref}$. Switches 164, 166, 168 and 170 operate in FIG. 21 as in FIG. 9, except that, as discussed above, signal H2VLTVR applied to logic 214 can cause all four switches to close during partial shutdown and the restore operation.

Figure 22:
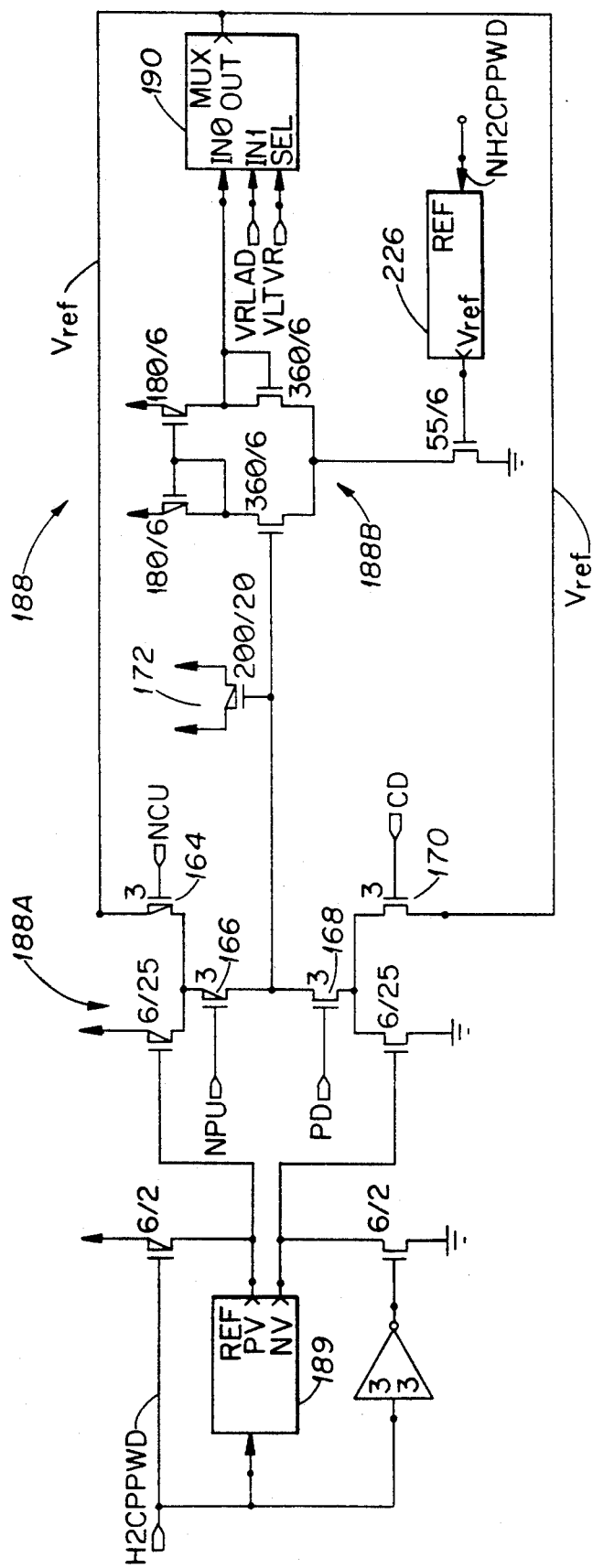
FIG. 22 shows one embodiment of a delay line charge pump, unity gain buffer and multiplexer of FIG. 21 that can be utilized in the apparatus of FIG. 14.
Figure 22A:
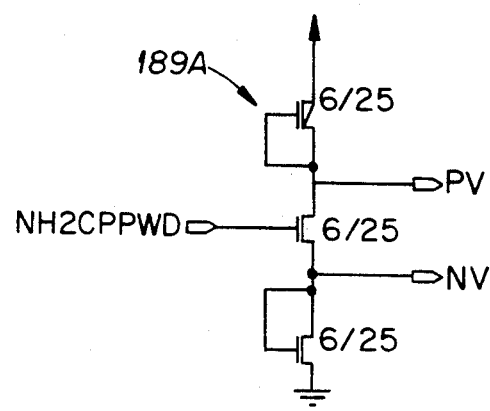
FIG. 22A shows a portion of the charge pump of FIG. 22.
Figure 23:
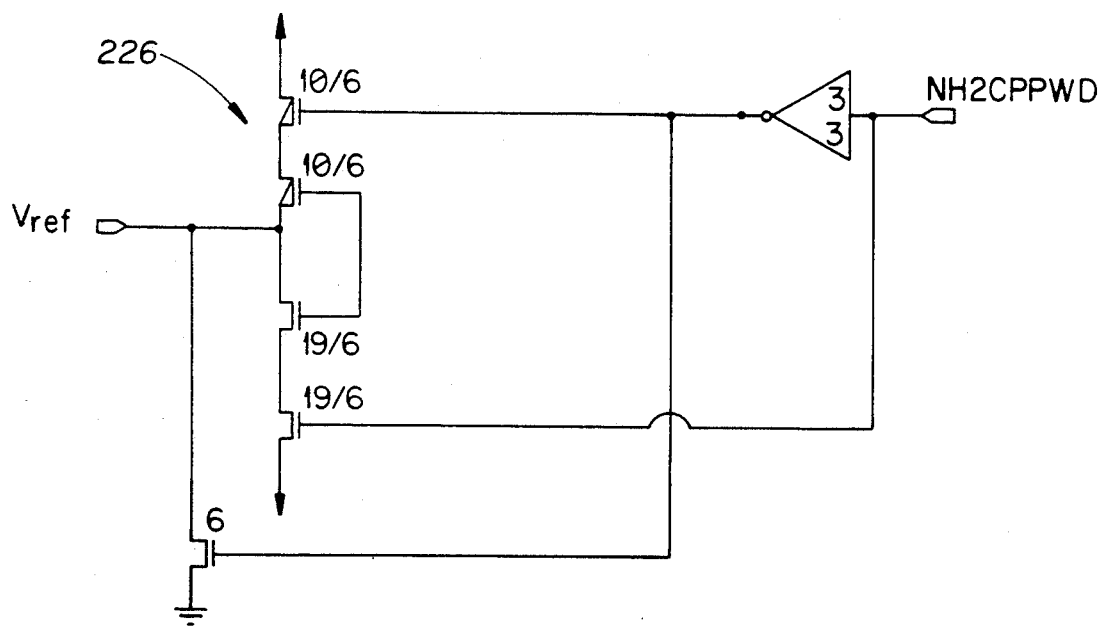
FIG. 23 shows one embodiment of an operational amplifier reference component that can be utilized in the apparatus of FIG. 22.
Figure 24:
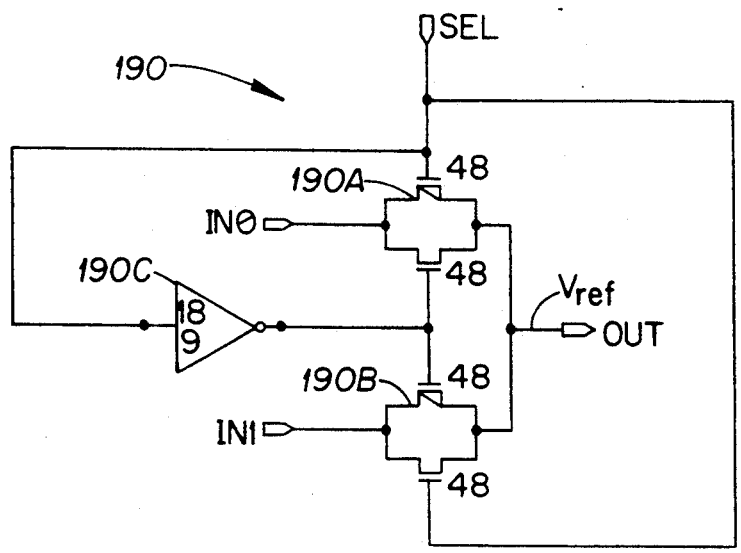
FIG. 24 shows one embodiment of a multiplexer that can be utilized in the apparatus of FIG. 22.

One embodiment of charge pump and op amp 188, and of multiplexer 190, is shown in greater detail in FIG. 22. Charge pump and op amp 188 includes charge pump 188A and unity-gain operational amplifier 188B. Differences of FIG. 22 from FIG. 10 (some of which are discussed above) include introduction of signal NH2CPPWD to control the current reference, and the operational amplifier reference 226, of charge pump and op amp 188; modification of the reference portion of the operational amplifier and of the left side of the charge pump largely to accommodate that control signal; and inclusion of multiplexer 190 at the output of charge pump and op amp 188. The left side of the charge pump 188A of FIG. 22 includes a current reference 189. Current reference 189 includes, for improved stability, preferably ten of current reference 189A shown in FIG. 22A. Otherwise, structure and operation of the structure of FIG. 22 is substantially similar to that of FIG. 10. Operational amplifier reference 226 is shown in greater detail in FIG. 23. Multiplexer 190 is shown in greater detail in FIG. 24. As shown in FIG. 24, multiplexer 190 includes CMOS switch 190A, CMOS switch 190B and buffer 190C. However, any other type of two-throw switch or two-to-one multiplexer could be utilized as multiplexer 190.

Figure 25:
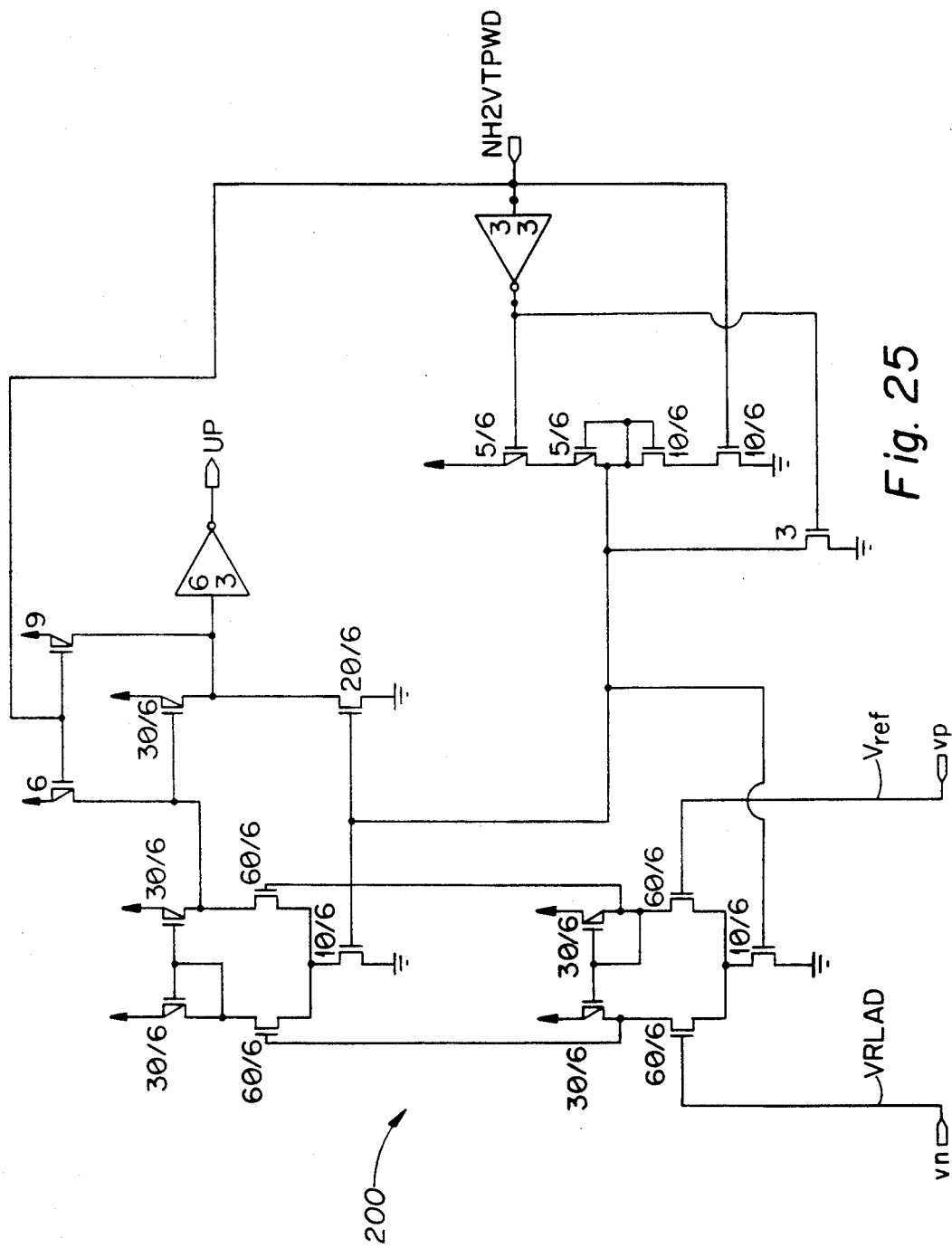
FIG. 25 shows one embodiment of a comparator that can be utilized in the apparatus of FIG. 14.

One embodiment of comparator 200 is shown in greater detail in FIG. 25. Positive and negative input terminals are respectively identified as vp and vn. The inverted output terminal produces signal UP.

Figure 26:
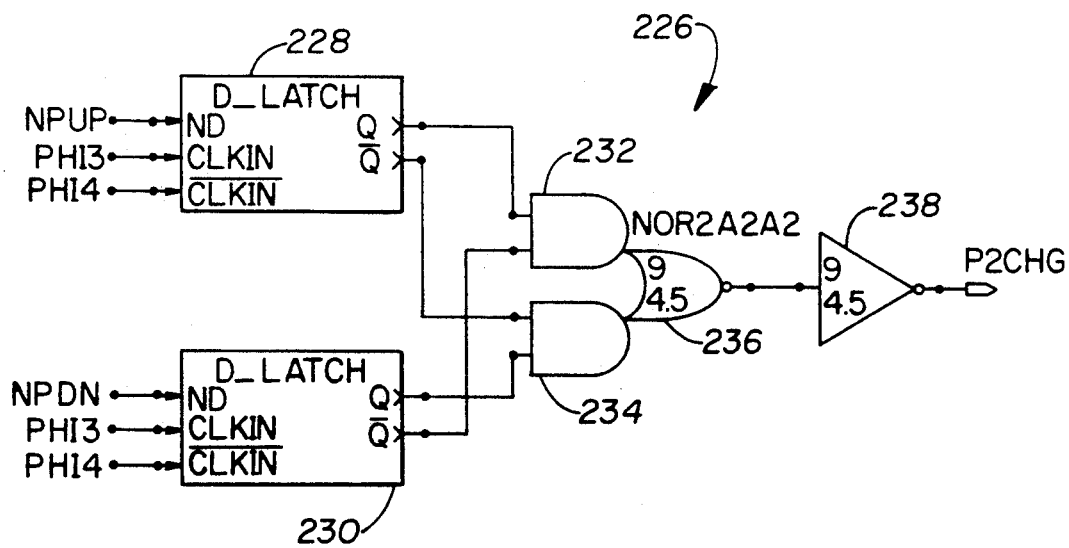
FIG. 26 shows one embodiment of a change detector that ca be utilized in the apparatus of FIG. 14.

One embodiment of change detector 204 is shown in greater detail in FIG. 26. As shown in FIG. 26, reference 226 includes two clocked D type latches or D type flipflops each producing a Q output and a not Q output. The outputs of latches 228 and 230 are provided to the inputs of AND gates 232 and 234, whose outputs are provided to the respective inputs of NOR gate 236. The output of NOR gate 236 is inverted and buffered by inverter 238 to produce signal P2CHG.

Although in the foregoing discussion an embodiment of the present invention for use with synchronous delay line 10. However, the present invention is not limited to utilization with a synchronous delay line. For example, as shown in FIG. 27, the present invention can be utilized with a phase-locked loop 240. Phase locked loops and their operation are described in greater detail in Gardner, F. M., *Phaselock Techniques*, 2nd ed. (John Wiley & Sons, New York, 1979), which is hereby incorporated by reference. Phase locked loop 240 includes phase detector 242, loop filter 244 and voltage-controlled oscillator 246. The input signal is provided to phase detector 242, which compares that signal with the reference signal provided to the phase detector by VCO 246. Alternatively, a mixer or multiplier may be used in place of phase detector 242. Also, loop filter 244 is a generic representation of any sort of electrical apparatus, which can be included in the phase-locked loop 240. Although the output is shown as being provided from loop filter 244, the loop output may be obtained from any portion of loop 240 as desired for the particular application. However, instead of the output of loop filter 244 being provided directly to VCO 246 to control the operation of the VCO, additional apparatus according to the present invention has been provided. Accordingly, multiplexer 248 multiplexes the signals produced by filter 244 and save and restore component 250. The output of multiplexer 248 is provided to VCO 246 and to comparator 252. Comparator 252 is also provided with the output of save and restore component 250. Comparator 252 compares the output of loop filter 244 with the output of save and restore component 250, and provides its output as a control signal to save and restore component 250. Although VCO 246 and save and restore component 250 are shown in FIG. 27 as being commonly clocked, they can alternatively be separately clocked. Multiplexer 248 and save and restore component 250 are controlled by power down signal PWDN. Structure and operation of multiplexer 248, save and restore component 250 and comparator 252 can be similar to that respectively described above for multiplexer 190, save and restore component 192 and comparator 200.

Although FIGS. 14–27 show the present invention as utilized in a feedback-controlled system, the present invention can be utilized in any signal-controlled system, whether or not feedback-controlled. For example, as shown in FIG. 28, save and restore component 254 can store and reproduce a control signal of system 256 via multiplexer 258. Multiplexer 258 determines whether the output of system 256 or the output of save and restore component 254 is to be provided a the control signal for system 256. System 256 can have one or more outputs. As with the system of FIG. 27, system 256 and save and restore component 254 can be commonly clocked or separately clocked. Structure and operation of multiplexer 258 and save and restore component 254 can be similar to that respectively described above for multiplexer 190 and save and restore component 192.

It should be understood that, although FETs are preferred, the present invention can be constructed in similar fashion with similar operation with devices other than those illustrated. For example, the transistors illustrated in the drawings can be N-channel FETs, P-channel FETs, CMOS, or bipolar transistors. The invention can be implemented in CMOS, NMOS, PMOS, bipolar or GaAs. All topologies shown in the drawings are equally valid for alternative transistors. Additionally, the illustrated topologies are useful for a wide range of possible device geometries, e.g., lengths and widths of diffusion regions.

Some of the many advantages of the invention should now be readily apparent. For example, novel apparatus and method have been provided which are capable of retaining a control signal in the event of partial shutdown of a system for provision of the retained signal to that system upon system retart. Such apparatus and method enables faster recovery from and reducing delays caused by partial shutdown of a control system. Such apparatus and method is capable of providing improved recovery from reduced-power operation of a control system. Also, a novel signal-controlled apparatus has been provided that is capable of retaining its control value(s) even if the apparatus is partially shut down, and, in the event of such partial shutdown, of enabling restarting of the apparatus at control value(s) at least sufficiently close to such value(s) at the time of such partial shutdown so that any delays resulting from reinstating the lost control value(s) are at least limited. Furthermore, a novel apparatus has been provided which is capable of generating a plurality of differently phased periodic signals that are corrected to have predetermined desired phase relationship, wherein the correction can be stored for use in the event of partial shutdown and restart of such apparatus.

Obviously, many modifications and variations of the present invention are possible in light of the above teachings. It is therefore to be understood that the foregoing embodiments are presented by way of example only and that, within the scope of the appended claims and equivalents thereto, the invention may be practiced otherwise than as specifically described.

What is claimed is:

1. Apparatus for storing a digital signal corresponding to the value of a predetermined control reference voltage at a specified time, comprising:
   a signal divider producing a plurality of predetermined analog voltage values;
   a counter responsive to a comparison signal for generating, from the value of the comparison signal at said time, the digital signal, wherein the digital signal is a function of a previous digital signal and the comparison signal;
   a first multiplexer receiving the digital signal and the plurality of predetermined analog voltage values, and providing at its output, responsive to the digital signal, one of the plurality of predetermined analog voltage values as a selected analog voltage value;
   a second multiplexer receiving the control reference voltage, a controller signal and the output of said first multiplexer and providing at its output, responsive to the controller signal, the selected analog voltage value during a power down situation and the control reference voltage during normal operation; and
   comparing means, receiving the output of the second multiplexer and the selected analog voltage value, for comparing the output of said second multiplexer with the selected analog voltage value and producing the comparison signal.

2. Apparatus as recited in claim 1, further comprising buffering means connected between said counter and said first multiplexer for buffering the digital signal before provision of the digital signal to said first multiplexer.

3. Apparatus as recited in claim 2 wherein said signal divider comprises a voltage divider.

4. Apparatus as recited in claim 2 wherein said signal divider comprises a current divider.

5. Apparatus as recited in claim 1 wherein said first multiplexer comprises:
   decoding means responsive to the digital signal for producing at least one decoded digital signal identifying one of the predetermined analog voltage values;
   storing means, receiving the at least one decoded digital signal, for storing the at least one decoded digital signal; and
   selecting means, responsive to the at least one decoded digital signal, for providing one of the predetermined analog voltage values, identified by the at least one decoded digital signal, as the selected analog voltage value.

6. Apparatus as recited in claim 1 wherein said first multiplexer comprises:
   decoding means responsive to the first count signal for producing at least one decoded count signal identifying one of the predetermined portions;
   storing means, receiving the at least one decoded count signal, for storing the at least one decoded count signal; and
   selecting means, responsive to the at least one decoded count signal, for providing one of the predetermined portions, identified by the at least one decoded count signal, as the selected signal.

7. Apparatus as recited in claim 6 wherein said storing means comprises a plurality of latches.

8. Apparatus as recited in claim 6 wherein:
   said decoding means produces as the least one decoded digital signal a plurality of parallel decoded digital signals, said plurality of parallel decoded digital signals being at least equal in number to the plurality of predetermined analog voltage values;
   said storing means comprises a plurality of latches being equal in number to the plurality of parallel decoded digital signals, each latch receiving one of the plurality of parallel decoded digital signals; and
   said selecting means comprises a plurality of switches being equal in number to the plurality of latches, each switch being controlled by a corresponding latch output and receiving a corresponding predetermined analog voltage value.

9. Apparatus as recited in claim 1, further comprising:
   a controller connected to said comparing means and said second multiplexer and controlling operation of at least said second multiplexer and of said comparing means such that said comparing means does not operate during at least part of the time while said second multiplexer selects and outputs wither the selected analog voltage value or the control reference voltage.

10. Apparatus as recited in claim 1, further comprising:
    control means connected to said counter, said second multiplexer and said comparing means, for controlling operation of at least said counter, said second multiplexer and said comparing means such that said comparing means and said counter do not operate during at least part of the time while said second multiplexer selects either the selected analog voltage value or the control reference voltage.

11. Apparatus as recited in claim 1, further comprising:
    control means connected to said signal divider, said counter, said first multiplexer, said second multiplexer, and said comparing means, for controlling operation of said signal divider, said counter, said first multiplexer, said second multiplexer and said comparing means such that the respective outputs of said counter and said first multiplexer at least do not change while said second multiplexer selects either the selected analog voltage value or the control reference voltage, and said signal divider and said comparing means are disabled during at least part of the time while said second multiplexer selects either the selected analog a voltage value or the control reference voltage.

12. A method for storing a digital signal corresponding to the value of a predetermined control reference voltage at a specified time, comprising the steps of:
    producing said digital signal and storing that digital signal;

producing, in response to the digital signal, an analog signal indicative of the value of said control reference voltage at said time;

selecting one of the analog signal or the control reference voltage to produce a selected signal;

comparing the selected signal with the analog signal; and incrementing or decrementing the digital signal based on whether the analog signal is less than, or greater than or equal to, the selected signal.

13. A synchronous delay line, comprising:

a multiple segment delay line comprising a plurality of delay components connected in cascade, each of said delay components producing a respective delay signal, wherein said multiple segment delay line receives a periodic signal for delay thereof and wherein the delay provided by each of said delay components is determined by a control reference voltage;

a first phase detector, receiving the periodic signal and a first plurality of the delay signals, determining whether there is any phase error between the produced delayed signals and the periodic signal, and producing at least one control signal indicative thereof;

control reference voltage generating means, responsive to the at least one control signal, for producing the control reference voltage;

means, receiving the control reference voltage, for storing an analog voltage corresponding to an earlier value of the control reference voltage and providing either the control reference voltage or the analog signal to the multiple segment delay line; and first signal processing means, responsive to a second plurality of the delay signals, for producing at least one output signal that is a sub-phase of the periodic signal.

14. A synchronous delay line as recited in claim 13 wherein said storing and providing means comprises:

means responsive to a comparison signal for generating, from the comparison signal a digital signal and for string that digital signal;

means for receiving the digital signal and producing the analog voltage;

a multiplexer receiving the analog voltage and the control reference voltage and selectively producing either the analog voltage or the control reference voltage; and comparing means, receiving the control reference voltage and the analog voltage, for comparing the control reference voltage with the analog voltage and producing the comparison signal, wherein the analog voltage is indicative of the control reference voltage.

15. A synchronous delay line as recited in claim 13 wherein:

said multiple segment delay line also receives an inverse periodic signal which is the inverse of the periodic signal;

said synchronous delay line further comprises a second phase detector, responsive to the inverse periodic signal and the plurality of signals each produced by a different delay component, for determining whether there is any phase error between the produced delayed signals and the inverse periodic signal, and producing at least one third control signal indicative thereof; and said control signal generating means is further responsive to the at least one third control signal, for producing the first control signal.

16. A synchronous delay line as recited in claim 13 wherein said first phase detector comprises:

a plurality of edge detector means, each of said edge detector means being connected to receive a signal having a respective delay of the periodic signal, for detecting whether an edge of the respective delayed signal is present, wherein one of said edge detector means is triggered to perform edge detection by the periodic signal, and each remaining said edge detector means is triggered by the output of another respective edge detector means, said plurality of edge detector means being thereby connected one to another in series; and first latching means, triggered by the periodic signal and operatively connected to an output of the last-connected of said plurality of edge detector means, for producing an output indicative of the present output of said last-connected of said plurality of edge detector means while said first latching means is triggered by the periodic signal, the output being indicative, while said first latching means is not triggered by the periodic signal, of the output of said last-connected of said edge detector means while the periodic signal was last triggering said first latching means, whereby the output signal produced by said first latching means is indicative of a phase error unless edges are detected in the respective differently delayed versions of the periodic signal by said plurality of edge detector means in sequence while the periodic signal triggers both said edge detector means and said first latching means.

17. A synchronous delay line as recited in claim 16 wherein said first latching means comprises a transparent latch.

18. A method for storing a digital signal corresponding to the value of a predetermined control signal at a specified time, comprising the steps of:

generating and storing the digital signal and using the digital signal to select one of a plurality of predetermined analog signals as a first selected signal;

selecting one of the first selected signal and the control reference voltage at said time to produce a second selected signal;

comparing a value of the second selected signal and a corresponding value of the fist selected signal;

incrementing or decrementing the digital signal, and correspondingly selecting a different one of the plurality of predetermined analog signals as the first selected signal, in response to whether the corresponding value of the selected signal of said generating step is less than, or greater than or equal to, the value of the second selected signal.

19. A method for storing a digital signal corresponding to the value of a predetermined control reference voltage at a specified time, comprising the steps of:

producing a plurality of predetermined divisions of an analog voltage value;

generating and storing the digital signal;

responsive to the digital signal, selecting one of the plurality of predetermined divisions of the analog voltage value as a first selected signal;

selecting one of the control reference voltage at sad time or the first selected signal to produce a second selected signal;

comparing a value of the second selected signal with a corresponding value of the first selected signal; and responsive to said comparing step, incrementing or decrementing the digital signal, and storing the so incremented or decremented digital signal.

20. Apparatus for storing a digital signal corresponding to the value of a predetermined control reference voltage at a specified time, comprising:

means for generating a plurality of analog signals, each of said analog signals having a respective predetermined value;

means, responsive to a comparison signal, for generating the digital signal, wherein said digital signal is a function of a past digital signal and said comparison signal;

means, responsive to the digital signal, for selectively producing one of said plurality of analog signals as a first selected signal;

means, receiving the control referenced voltage and the first selected signal, for selectively producing either the control reference voltage or the first selected signal as a second selected signal; and means, receiving the second selected signal and the first selected signal, for generating the comparison signal indicative of a comparison of the first selected signal with the second selected signal.

21. Apparatus for storing a digital signal corresponding to the value of a predetermined control reference voltage at a specified time, comprising:

means responsive to a comparison signal for generating, from the value of the comparison signal at said time, the digital signal, and for storing that digital signal, the means for generating including a counter, and wherein the digital signal is a function of a previously generated digital signal and the comparison signal;

means for receiving the digital signal and producing a corresponding analog signal, the means for receiving and producing including a signal divider producing a plurality of predetermined analog signals, and a first multiplexer receiving the digital signal and the plurality of analog signals and producing, at its output, responsive to the digital signal, one of the analog signals;

a second multiplexer receiving the control reference voltage, a controller signal and the output of said first multiplexer and producing at its output, responsive to the controller signal, the selected analog signal during a power down situation and the control reference voltage during normal operation and comparing means, receiving the output from the second multiplexer and the one analog signal, for comparing the output of said second multiplexer with the one analog signal and producing the comparison signal, wherein the one analog signal is indicative of the value of the control reference voltage at said time.

22. Apparatus as recited in claim 21 further including a controller connected to said comparing means and said second multiplexer controlling operation of said comparing means and said second multiplexer such that said comparing means does not operate during at least part of the time while said second multiplexer selects and outputs either the selected analog signal or the control reference voltage.

* * * * *